(12) United States Patent
Nishiyama

(10) Patent No.: US 10,283,380 B2
(45) Date of Patent: May 7, 2019

(54) SUBSTRATE PROCESSING APPARATUS

(71) Applicant: SCREEN HOLDINGS CO., LTD., Kyoto (JP)

(72) Inventor: Koji Nishiyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 194 days.

(21) Appl. No.: 15/245,894

(22) Filed: Aug. 24, 2016

(65) Prior Publication Data

US 2017/0056936 A1    Mar. 2, 2017

(30) Foreign Application Priority Data

Aug. 26, 2015 (JP) .................................. 2015-166776

(51) Int. Cl.
| | |
|---|---|
| H01L 21/67 | (2006.01) |
| H01L 21/687 | (2006.01) |
| B08B 1/04 | (2006.01) |
| B08B 3/02 | (2006.01) |

(52) U.S. Cl.
CPC .......... *H01L 21/67051* (2013.01); *B08B 1/04* (2013.01); *B08B 3/02* (2013.01); *H01L 21/67028* (2013.01); *H01L 21/68728* (2013.01); *B08B 2203/0229* (2013.01)

(58) Field of Classification Search
None
See application file for complete search history.

(56) References Cited

U.S. PATENT DOCUMENTS

| | | | |
|---|---|---|---|
| 6,533,864 B1 * | 3/2003 | Matsuyama | ........ H01L 21/6715 118/500 |
| 2007/0189942 A1 | 8/2007 | Ryu | .............................. 422/300 |
| 2009/0320885 A1 * | 12/2009 | Inoue | ................ H01L 21/31138 134/104.2 |
| 2010/0227056 A1 | 9/2010 | Takayanagi et al. | .......... 427/240 |
| 2011/0021038 A1 | 1/2011 | Murata et al. | ................ 438/795 |
| 2011/0021039 A1 | 1/2011 | Murata et al. | ................ 438/795 |
| 2012/0192899 A1 | 8/2012 | Higashijima | ................ 134/22.1 |
| 2013/0220368 A1 | 8/2013 | Ishibashi | .......................... 134/6 |

(Continued)

FOREIGN PATENT DOCUMENTS

| | | |
|---|---|---|
| CN | 102569133 A | 7/2012 |
| CN | 203260558 U | 10/2013 |

(Continued)

*Primary Examiner* — Jason Y Ko
*Assistant Examiner* — Cristi J Tate-Sims
(74) *Attorney, Agent, or Firm* — Ostrolenk Faber LLP

(57) ABSTRACT

A cleaning drying processing unit includes a lower spin chuck, a splash prevention cup, and a storage member. The splash prevention cup is provided to surround the lower spin chuck, and has an annular opening that can be opposite to an outer peripheral end of a substrate rotated by the lower spin chuck. A lower portion of the splash prevention cup is stored in the storage member. Cleaning and drying processing using a cleaning liquid are performed on the substrate rotated by the lower spin chuck. At this time, the splash prevention cup is supported such that the annular opening is opposite to the outer peripheral end of the substrate. Gas in a space opposite to the annular opening is sucked from the annular opening through a first annular space of the splash prevention cup and a second annular space in the storage member.

9 Claims, 15 Drawing Sheets

(56) References Cited

U.S. PATENT DOCUMENTS

| | | |
|---|---|---|
| 2014/0322926 A1 | 10/2014 | Murata et al. ................ 438/795 |
| 2015/0090298 A1 | 4/2015 | Nagashima et al. ............ 134/19 |
| 2015/0179484 A1 | 6/2015 | Ishibashi ........................ 451/73 |
| 2016/0236239 A1 | 8/2016 | Nishiyama |

FOREIGN PATENT DOCUMENTS

| | | |
|---|---|---|
| CN | 104517875 A | 4/2015 |
| JP | 03-175617 | 7/1991 |
| JP | 2010-016098 A | 1/2010 |
| JP | 2012-170872 A | 9/2012 |
| KR | 10-0757846 B1 | 9/2007 |
| KR | 10-0790254 B1 | 12/2007 |
| KR | 10-2009-0063729 A | 6/2009 |
| KR | 20-2013-0003551 U | 6/2013 |
| KR | 20-2013-0003552 U | 6/2013 |
| TW | 201239971 A1 | 10/2012 |
| TW | 201250895 A | 12/2012 |
| TW | I390654 B1 | 3/2013 |

\* cited by examiner

F I G. 7
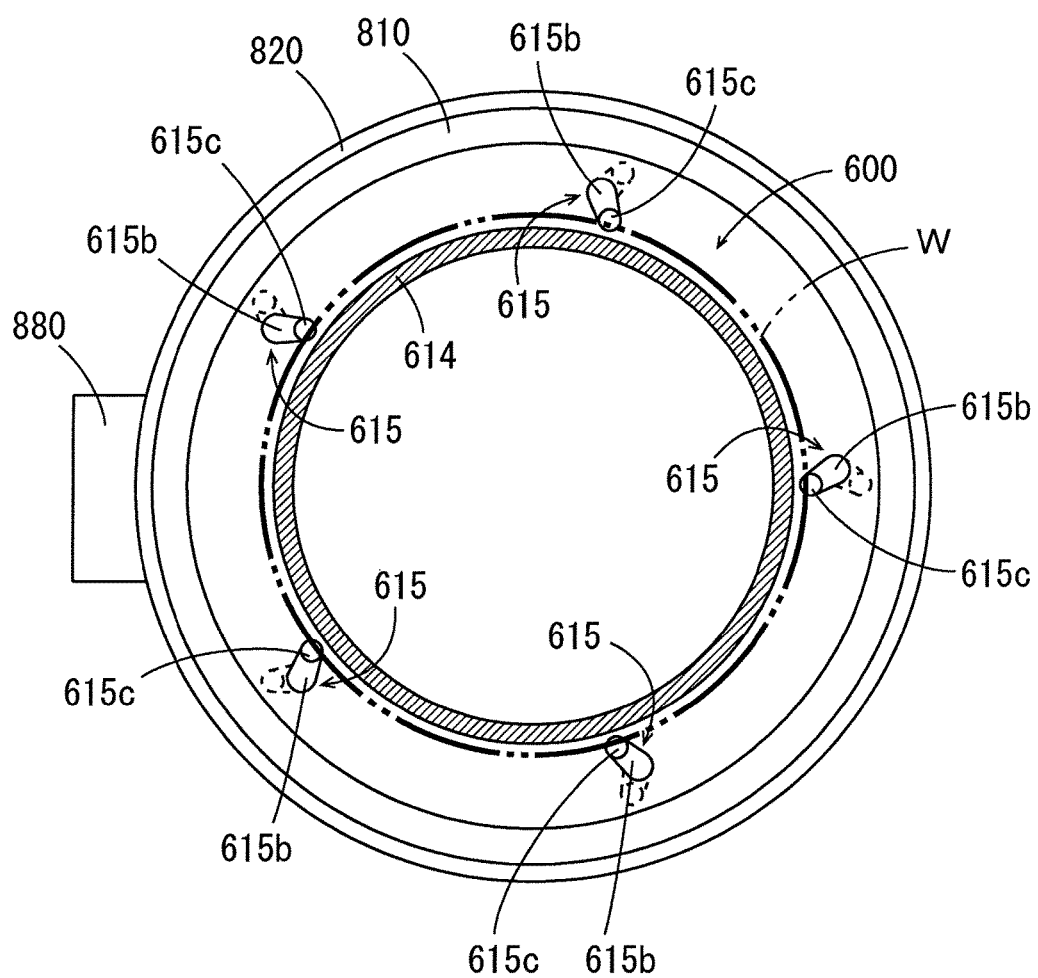

SUBSTRATE PROCESSING APPARATUS

BACKGROUND OF THE INVENTION

Field of the Invention

The present invention relates to a substrate processing apparatus.

Description of Related Art

Substrate processing apparatuses are used to subject substrates such as semiconductor substrates, substrates for liquid crystal display devices, substrates for plasma displays, substrates for optical discs, substrates for magnetic discs, substrates for magneto-optical discs, substrates for photomasks and other substrates to various types of processing.

In the substrate processing apparatus, a processing liquid is supplied to a main surface (an upper surface) of the substrate rotated by a spin chuck, for example. A splash prevention member is provided to surround the substrate held by the spin chuck. The processing liquid, splashed from the substrate, of the supplied processing liquid is received by the splash prevention member. At this time, splashes and a mist of the processing liquid splashed from the substrate may adhere to a back surface (a lower surface) of the substrate.

In a rotary main surface treatment apparatus described in JP 3-175617 A, a circular current member having an inclined current surface is provided below the spin chuck. Further, an outer cup is provided to surround a splash prevention cup (a splash prevention member). A divert path for letting a flow of gas flow from above is formed between the splash prevention cup and the outer cup. The divert path communicates with a space between the back surface of the substrate held by the spin chuck and the inclined current surface of the current member.

In this case, the gas flowing between the splash prevention cup and the outer cup due to a downflow of gas in the processing chamber is led to the space between the back surface of the substrate and the inclined current surface of the current member through the divert path. The led gas flows from the center of the substrate towards the peripheral edge of the substrate below the substrate. Thus, splashes and a mist of the processing liquid are prevented from flowing to the back surface side of the substrate.

BRIEF SUMMARY OF THE INVENTION

The state of the downflow of gas formed in the processing chamber is not necessarily kept uniform and constant in an inner space of the processing chamber. When a flow amount of gas flowing between the splash prevention cup and the outer cup is small, a sufficient flow of gas for preventing splashes and a mist of the processing liquid from flowing to a space below the substrate cannot be generated. Further, when a flow amount of gas flowing from a position above the substrate held by the spin chuck to the inside of the splash prevention cup is large, turbulence is generated around the outer peripheral end of the substrate. When splashes and a mist of the processing liquid splashed outward from the outer peripheral end of the substrate returns to a space on the lower surface side of the substrate due to the generated turbulence, the processing liquid adheres again to the lower surface of the substrate.

An object of the present invention is to provide a substrate processing apparatus in which a processing liquid can be prevented from adhering again to a lower surface of a substrate.

(1) According to one aspect of the present invention, a substrate processing apparatus includes a substrate holder that holds and rotates a substrate about a vertical axis, a processing liquid supplier that supplies a processing liquid to the substrate held by the substrate holder, a splash preventer configured to receive the processing liquid splashed to surroundings from the rotating substrate, a storage that stores a lower portion of the splash preventer, a driver that moves the splash preventer in an up-and-down direction relative to the storage, and a gas discharger, wherein the splash preventer includes a first inner wall provided to surround an inner space including the substrate held by the substrate holder and a region lower than the substrate, a first outer wall provided to surround outside of the first inner wall, a coupler that couples the first inner wall to the first outer wall such that a first annular space is formed between the first inner wall and the first outer wall, and an annular outer upper member connected to the first outer wall to cover an upper portion of the first annular space, an annular opening being able to be opposite to an outer peripheral end of the substrate held by the substrate holder is formed between the first inner wall and the annular outer upper member, the storage includes a second inner wall provided to surround the inner space, a second outer wall provided to surround outside of the second inner wall, and a bottom member that couples the second inner wall to the second outer wall such that a second annular space is formed between the second inner wall and the second outer wall, the lower portion of the splash preventer is stored in the second annular space of the storage to be movable in the up-and-down direction such that the first annular space and the second annular space of the splash preventer communicate with each other, and the gas discharger is provided to suck gas in the inner space through the annular opening, the first annular space and the second annular space to discharge the gas from the second annular space with the annular opening being opposite to the peripheral end of the substrate held by the substrate holder.

In the splash preventer of the substrate processing apparatus, the first annular space is formed between the first inner wall and the first outer wall by coupling of the first inner wall to the first outer wall by the coupler. The upper portion of the first annular space is covered by the annular outer upper member connected to the first outer wall. The annular opening that can be opposite to the outer peripheral end of the substrate held by the substrate holder is formed between the first inner wall and the annular outer upper member.

Further, in the storage, the second annular space is formed between the second inner wall and the second outer wall by coupling of the second inner wall to the second outer wall by the bottom member. The lower portion of the splash preventer is stored in the second annular space to be movable in the up-and-down direction such that the first annular space and the second annular space communicate with each other.

During the processing for the substrate, the splash preventer is moved in the up-and-down direction with respect to the storage, so that the annular opening is opposite to the outer peripheral end of the substrate held by the substrate holder. In this state, the processing liquid is supplied to the substrate rotated about the vertical axis. At this time, the gas in the inner space is sucked by the gas discharger through the annular opening, the first annular space and the second annular space. Thus, a flow of gas flowing from the outer peripheral end of the rotating substrate to the annular opening is formed. At this time, because a flow of gas flowing towards a position below the substrate through a gap between the outer peripheral end of the substrate and the annular opening is shielded, generation of turbulence in the inner space is prevented. Splashes and a mist of the processing liquid splashed outward from the outer peripheral end of the rotating substrate are sucked into the first annular space from the annular opening together with gas, and led to the gas discharger through the second annular space. In this case, because the inner space is surrounded by the first inner wall and the second inner wall, the gas, and splashes and a mist of the processing liquid led to the gas discharger are prevented from returning to the space on the lower surface side of the substrate. Further, because the splash preventer can move in the up-and-down direction with the lower portion of the splash preventer that forms the first annular space being stored in the storage that forms the second annular space, gas, and splashes and a mist of the processing liquid are prevented from leaking to the inner space from the boundary portion between the first annular space and the second annular space. As a result, the processing liquid splashed from the substrate is prevented from adhering again to the lower surface of the substrate.

(2) The coupler may include an annular plate that couples a lower end of the first inner wall to a lower end of the first outer wall, and the annular plate may have one or a plurality of communication openings that connects the first annular space to the second annular space.

In this case, the first inner wall and the first outer wall can be coupled to each other with a simple configuration, and the first annular space and the second annular space can communicate with each other.

(3) The one or the plurality of communication openings may include a plurality of communication holes dispersively arranged in a circumferential direction.

In this case, the gas in the first annular space, and splashes and a mist of the processing liquid are substantially uniformly led to the entire second annular space. Thus, the suction force for the gas at the annular opening is dispersed in a circumferential direction. As a result, splashes and a mist of the processing liquid splashed from the entire circumference of the substrate are sucked into the first inner space from the annular opening.

(4) The gas discharger may be provided to communicate with the second annular space in one portion of the storage, and the plurality of communication holes may be arranged such that distances between adjacent communication holes decrease as the communication holes are positioned farther away from the portion of the storage.

In this case, the suction force by the gas discharger in the second annular space decreases as the suction force is positioned farther away from the gas discharger. Thus, in the above-mentioned configuration, distances between adjacent communication holes decrease as the communication holes are positioned farther away from the gas discharger. Thus, it is possible to substantially uniformly lead the gas, splashes and a mist of the processing liquid from the first annular space to the entire second annular space without providing gas dischargers at a plurality of locations.

(5) The substrate processing apparatus may further include a gas discharge space former formed to surround a space coming into contact with a partial region of an outer peripheral surface of the second outer wall as a gas discharge space, and a liquid discharger, wherein a first opening that connects the second annular space to the gas discharge space may be provided at the partial region of the second outer wall, a second opening that connects the gas discharge space to the gas discharger may be provided at the air discharge space former, the second opening may be located at a position higher than the first opening, and a liquid discharge port that connects the second annular space to the liquid discharger may be provided at the bottom member of the storage.

In this case, a large part of splashes and a mist of the processing liquid led to the second annular space is led to the liquid discharge port of the bottom member of the storage by gravity. On the one hand, the gas led to the second annular space is led to the gas discharge space through the first opening, and is led to the gas discharger through the second opening. In the above-mentioned configuration, because the second opening is located at a position higher than the first opening, an amount of splashes and a mist of the processing liquid led to the gas discharger together with gas decrease. Therefore, the processing liquid can be efficiently collected.

(6) The annular outer upper member may be curved outward and upward from an upper end of the first outer wall, be further curved inward to cover an upper portion of the first annular space, and may form an upper edge of the annular opening.

In this case, the gas, and splashes and a mist of the processing liquid sucked into the first annular space from the annular opening are smoothly led downward along the inner peripheral surface of the annular outer upper member. Further, because the inner peripheral surface of the annular outer upper member facing the annular opening is curved to bulge outward, the gas, and splashes and a mist of the processing liquid that has collided with the inner peripheral surface of the annular outer upper member are received at the curved inner peripheral surface without being reflected in a direction of returning to the annular opening. Therefore, the gas, and splashes and a mist of the processing liquid sucked into the annular opening are prevented from leaking out from the annular opening.

(7) The splash preventer may further include an annular inner upper member that is curved outward and upward from the first inner wall and further curved inward to form a lower edge of the annular opening.

In this case, a passage extending substantially in parallel with the substrate from the upper edge and the lower edge of the annular opening to connect to the first annular space is formed by the annular outer upper member and the annular inner upper member. Thus, a flow of gas parallel to the substrate is easily formed to flow from the outer peripheral end of the substrate to the annular opening.

(8) The substrate holder may include a suction holder that is configured to be rotatable about the vertical axis and sucks a center portion of a lower surface of the substrate, and a first rotation driver that rotates the suction holder.

The configuration enables the processing liquid to be prevented from adhering again to the lower surface of the substrate in the case where the processing liquid is supplied to the upper surface of the substrate with the center portion of the lower surface of the substrate being held by suction.

(9) The substrate holder may include a rotator configured to be rotatable about the vertical axis, a second rotation driver that rotates the rotator, and an abutment holder that is arranged below the rotator and holds the substrate by abutting against the outer peripheral end of the substrate.

The configuration enables splashes of the processing liquid to be prevented from adhering to the lower surface of the substrate in the case where the processing liquid is supplied to the lower surface of the substrate with the substrate being held below the rotator by abutment of the abutment holder against the outer peripheral end of the substrate.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 7 is a schematic plan view for explaining the configuration of an upper spin chuck used in the cleaning drying processing unit of FIG. 5;

DESCRIPTION OF THE PREFERRED EMBODIMENTS

A substrate processing apparatus according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

(1) Configuration of Substrate Processing Apparatus

Figure 1:
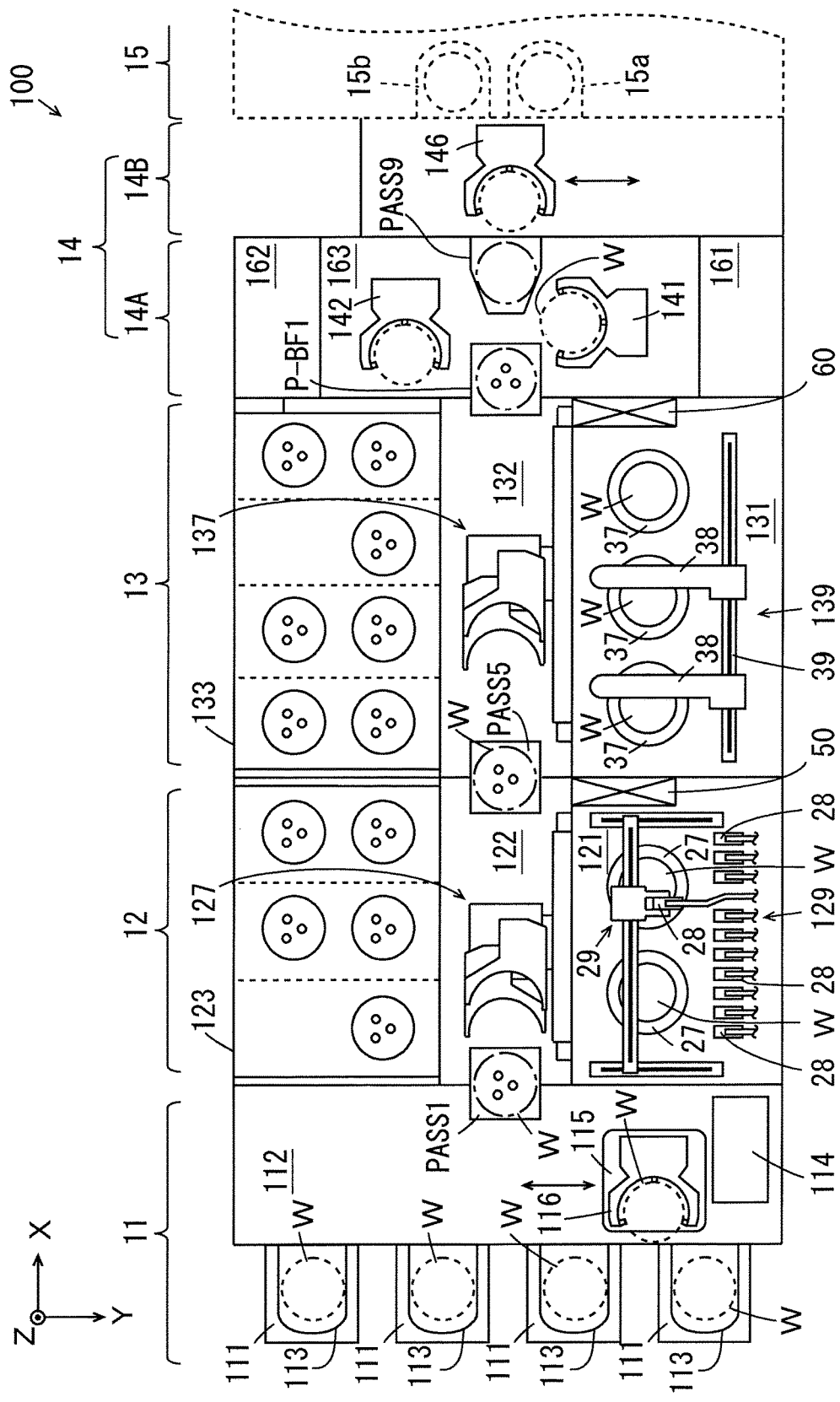
FIG. 1 is a schematic plan view of a substrate processing apparatus according to one embodiment of the present invention.

FIG. 1 is a schematic plan view of the substrate processing apparatus according to one embodiment of the present invention.

FIG. 1 and the subsequent drawings are accompanied by the arrows that indicate X, Y, and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out (indexer) block 14B. An interface block 14 is constituted by the cleaning drying processing block 14A and the carry-in carry-out block 14B. An exposure device 15 is arranged to be adjacent to the carry-in carry-out block 14B. In the exposure device 15, exposure processing is performed on the substrate W using a liquid immersion method. In the exposure device 15, the exposure processing for the substrate W may be performed without liquid.

As shown in FIG. 1, the indexer block 11 includes a plurality of carrier platforms 111 and a transport section (a transport space) 112. In each carrier platform 111, a carrier 113 for storing the plurality of substrates W in multiple stages is placed.

In the transport section 112, a controller 114 and a transport mechanism (a transport robot) 115 are provided. The controller 114 controls various constituent elements of the substrate processing apparatus 100. The transport mechanism 115 has a hand 116 for holding the substrate W. The transport mechanism 115 transports the substrate W while holding the substrate W by the hand 116.

The first processing block 12 includes a coating processing section (a coating processing space) 121, a transport section (a transport space) 122 and a thermal processing section (a thermal processing space) 123. The coating processing section 121 and the thermal processing section 123 are provided to be opposite to each other with the transport section 122 sandwiched therebetween. A substrate platform PASS1, and substrate platforms PASS2 to PASS4 that are described below (see FIG. 4) on which the substrates W are placed are provided between the transport section 122 and the indexer block 11. A transport mechanism (a transport robot) 127, and a transport mechanism (a transport robot) 128 that is described below (see FIG. 4), which transport the substrates W, are provided in the transport section 122.

The second processing block 13 includes a coating development processing section (a coating development processing space) 131, a transport section (a transport space) 132 and a thermal processing section (a thermal processing space) 133. The coating development processing section 131 and the thermal processing section 133 are opposite to each other with the transport section 132 sandwiched therebetween. A substrate platform PASS5 and substrate platforms PASS6 to PASS8 (see FIG. 4) on which the substrates W are placed, are provided between the transport section 132 and the transport section 122. A transport mechanism (a transport robot) 137 and a transport mechanism (a transport robot) 138 that is described below (see FIG. 4), which transport the substrates W, are provided in the transport section 132.

The cleaning drying processing block 14A includes cleaning drying processing sections (cleaning drying processing spaces) 161, 162 and a transport section (a transport space) 163. The cleaning drying processing sections 161, 162 are provided to be opposite to each other with the transport section 163 sandwiched therebetween. Transport mechanisms (transport robots) 141, 142 are provided in the transport section 163.

A placement buffer unit P-BF1, and a placement buffer unit P-BF2 that is described below, (see FIG. 4) are provided between the transport section 163 and the transport section 132.

Further, a substrate platform PASS9, and placement cooling platforms P-CP (see FIG. 4) that are described below are provided to be adjacent to the carry-in carry-out block 14B between the transport mechanisms 141, 142. In each placement cooling platform P-CP, the substrate W is cooled to a temperature suitable for the exposure processing.

A transport mechanism (a transport robot) 146 is provided in the carry-in carry-out block 14B. The transport mechanism 146 carries in the substrate W to and carries out the substrate W from the exposure device 15. A substrate inlet 15a for carrying in the substrate W and a substrate outlet 15b for carrying out the substrate W are provided in the exposure device 15.

Figure 2:
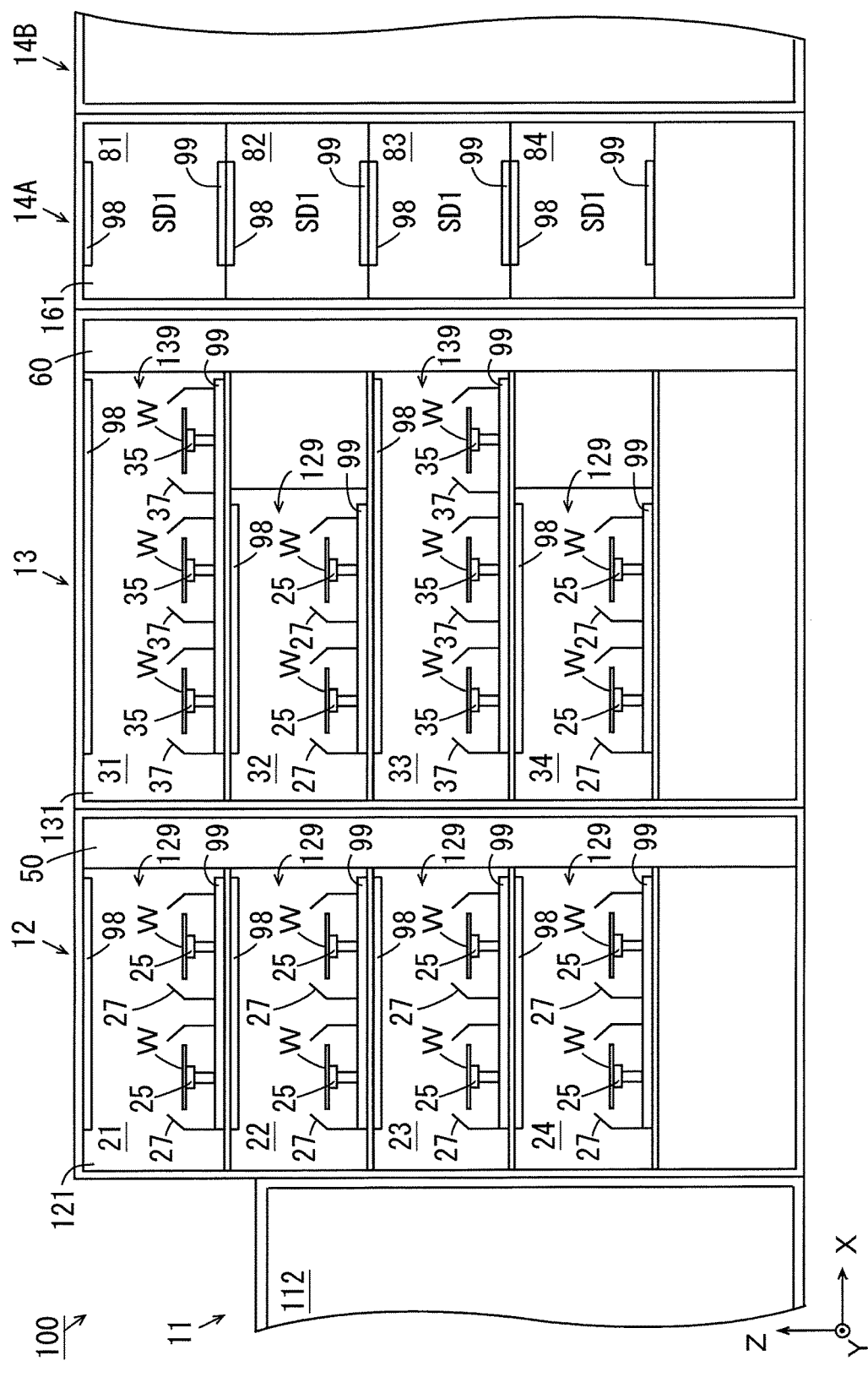
FIG. 2 is a schematic side view of the substrate processing apparatus mainly showing a coating processing section, a coating development processing section, and a cleaning drying processing section of FIG. 1.

(2) Configuration of Coating Processing Section and Coating Development Processing Section FIG. 2 is a schematic side view of the substrate processing apparatus 100 mainly showing the coating processing section 121, the coating development processing section 131 and the cleaning drying processing section 161 of FIG. 1.

As shown in FIG. 2, the coating processing section 121 has coating processing chambers 21, 22, 23, 24 provided in a stack. Each of the coating processing chambers 21 to 24 is provided with a coating processing unit (a coater) 129. The coating development processing section 131 has development processing chambers 31, 33 and coating processing chambers 32, 34 provided in a stack. Each of the development processing chambers 31, 33 is provided with a development processing unit (a developer) 139, and each of the coating processing chambers 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two spin chucks 25 and two cups 27. The spin chucks 25 are driven to be rotated by a driving device (a driver) (an electric motor, for example) that is not shown. Further, as shown in FIG. 1, each coating processing unit 129 includes a plurality of processing liquid nozzles 28 that discharge a processing liquid and a nozzle transport mechanism (a nozzle transport robot) 29 that transports the processing liquid nozzles 28.

In the coating processing unit 129, each of the spin chucks 25 is rotated by a driving device (a driver) (not shown), and any processing liquid nozzle 28 of the plurality of processing liquid nozzles 28 is moved to a position directly upward of the substrate W by the nozzle transport mechanism 29, and the processing liquid is discharged from the processing liquid nozzle 28. Thus, the processing liquid is applied to the upper surface of the substrate W. Further, a rinse liquid is discharged to a peripheral portion of the substrate W from an edge rinse nozzle (not shown). Thus, the processing liquid adhering to the peripheral portion of the substrate W is removed.

In the coating processing unit 129 in each of the coating processing chambers 22, 24, a processing liquid for an anti-reflection film is supplied to the substrate W from the processing liquid nozzle 28. In the coating processing unit 129 in each of the coating processing chambers 21, 23, a processing liquid for a resist film is supplied to the substrate W from the processing liquid nozzle 28. In the coating processing unit 129 in each of the coating processing chambers 32, 34, a processing liquid for a resist cover film is supplied to the substrate W from the processing liquid nozzle 28.

Similarly to the coating processing unit 129, the development processing unit 139 includes spin chucks 35 and cups 37. Further, as shown in FIG. 1, the development processing unit 139 includes two development nozzles 38 that discharge a development liquid and a moving mechanism (a moving robot) 39 that moves the development nozzles 38 in the X direction.

In the development processing unit 139, the spin chuck 35 is rotated by a driving device (a driver) (not shown), and one development nozzle 38 supplies the development liquid to each substrate W while being moved in the X direction. Thereafter, the other development nozzle 38 supplies the development liquid to each substrate W while being moved. In this case, the development processing for the substrate W is performed by supply of the development liquid to the substrate W. Further, in the present embodiment, development liquids different from each other are discharged from the two development nozzles 38. Thus, two types of development liquids can be supplied to each substrate W.

In the cleaning drying processing section 161, cleaning drying processing chambers 81, 82, 83, 84 are provided in a stack. In each of the cleaning drying processing chambers 81 to 84, a cleaning drying processing unit (a cleaning drying processor) SD1 is provided. In the cleaning drying processing unit SD1, cleaning and drying processing for the substrate W before the exposure processing are performed. Details of the cleaning drying processing unit SD1 are described below.

In each of the coating processing chambers 21 to 24, 32, 34, the development processing chambers 31, 33, and the cleaning drying processing chambers 81 to 84, an air supply unit (an air supplier) 98 and a gas discharge unit (a gas discharger) 99 are provided. The air supply unit 98 is provided on the ceiling of the processing chamber or in the vicinity of the ceiling, and supplies clean air of which a temperature and humidity are adjusted to the processing chamber. As the air supply unit 98, a fan filter unit (a fan filter), for example, is used. The gas discharge unit 99 is provided at the bottom of the processing chamber or in the vicinity of the bottom, and leads an atmosphere in the processing chamber to a gas discharge system (a gas discharger) in a factory. The air supplied from the air supply unit 98 to the processing chamber is discharged from the gas discharge unit 99, so that a downflow of clean air is formed in the processing chamber.

As shown in FIGS. 1 and 2, a fluid box 50 is provided in the coating processing section 121 to be adjacent to the coating development processing section 131. Similarly, a fluid box 60 is provided in the coating development processing section 131 to be adjacent to the cleaning drying processing block 14A. The fluid box 50 and the fluid box 60 each house fluid related elements such as a pipe, a joint, a valve, a flowmeter, a regulator, a pump, a temperature adjuster used to supply a processing liquid and a development liquid to the coating processing units 129 and the development processing units 139 and discharge the chemical liquid and air and the like out of the coating processing units 129 and the development processing units 139.

(3) Configuration of Thermal Processing Sections

Figure 3:
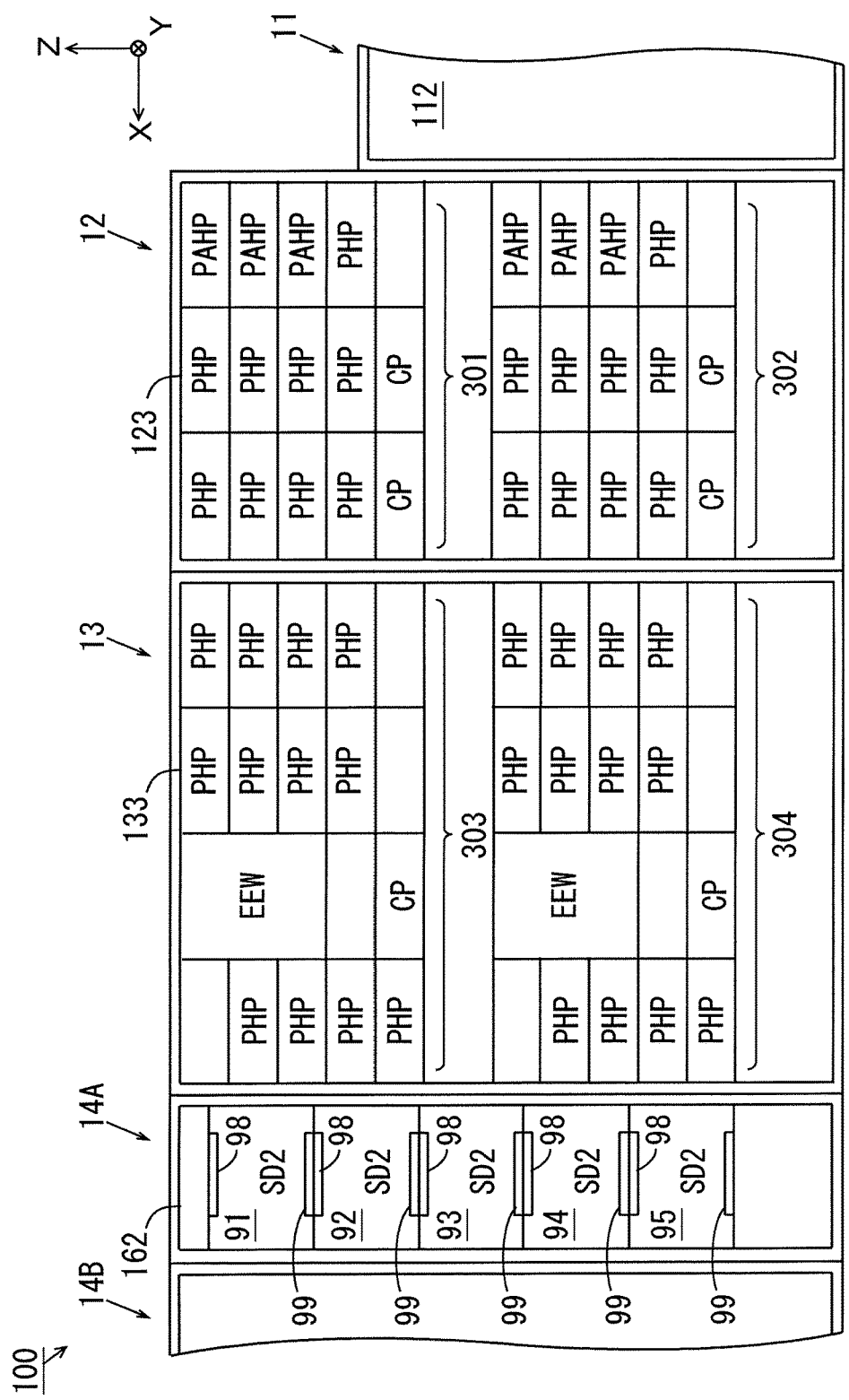
FIG. 3 is a schematic side view of the substrate processing apparatus mainly showing a thermal processing section and the cleaning drying processing section of FIG. 1.

FIG. 3 is a schematic side view of the substrate processing apparatus 100 mainly showing the thermal processing sections 123, 133 and the cleaning drying processing section 162 of FIG. 1. As shown in FIG. 3, the thermal processing section 123 has an upper thermal processing section 301 provided above and a lower thermal processing section 302 provided below. A plurality of thermal processing units (thermal processors) PHP, a plurality of adhesion reinforcement processing units (adhesion reinforcement processors) PAHP and a plurality of cooling units (cooling plates) CP are provided in each of the upper thermal processing section 301 and the lower thermal processing section 302.

Heating processing for the substrate W is performed in each thermal processing unit PHP. In each adhesion reinforcement processing unit PAHP, adhesion reinforcement processing for improving adhesion between the substrate W and the anti-reflection film is performed. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing for the substrate W is performed.

The thermal processing section 133 has an upper thermal processing section 303 provided above and a lower thermal processing section 304 provided below. A cooling unit CP, a plurality of thermal processing units PHP and an edge exposure unit EEW are provided in each of the upper thermal processing section 303 and the lower thermal processing section 304.

In the edge exposure unit EEW, exposure processing (edge exposure processing) is performed on a region having a constant width at the peripheral portion of the resist film formed on the substrate W. In each of the upper thermal processing section 303 and the lower thermal processing section 304, each thermal processing unit PHP provided to be adjacent to the cleaning drying processing block 14A is configured to be capable of receiving the substrate W carried in from the cleaning drying processing block 14A.

In the cleaning drying processing section 162, cleaning drying processing chambers 91, 92, 93, 94, 95 are provided in a stack. In each of the cleaning drying processing chambers 91 to 95, a cleaning drying processing unit (a cleaning drying processor) SD2 is provided. Each cleaning drying processing unit SD2 has the same configuration as the cleaning drying processing unit SD1. In the cleaning drying processing unit SD2, cleaning and drying processing for the substrate W after the exposure processing are performed. In each of the cleaning drying processing chambers 91 to 95, similarly to the above-mentioned cleaning drying processing chambers 81 to 84, the air supply unit 98 and the gas discharge unit 99 are provided. Thus, a downflow of clean air is formed in each processing chamber.

(4) Configuration of Transport Sections

Figure 4:
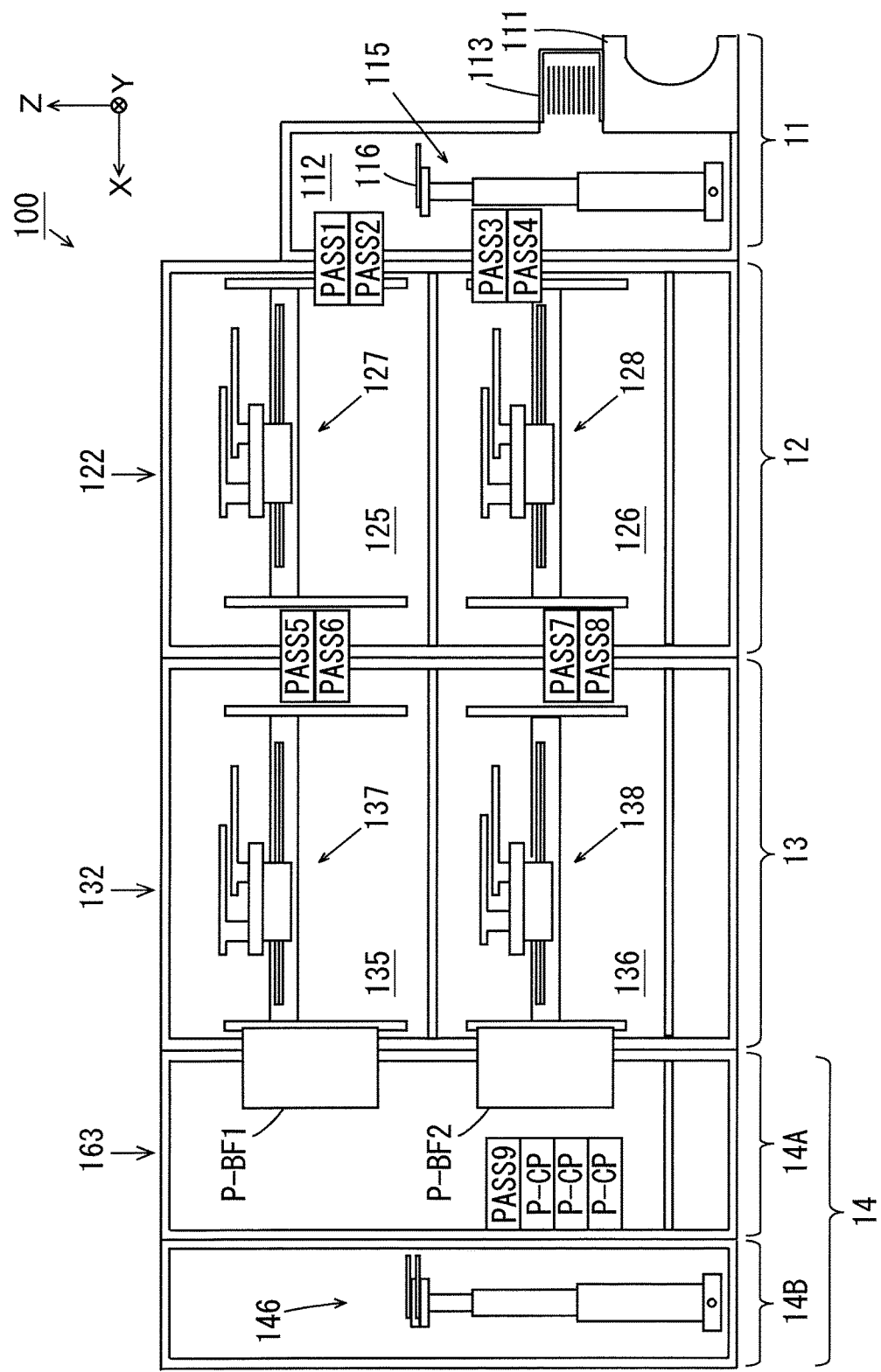
FIG. 4 is a side view mainly showing a transport section of FIG. 1.

FIG. 4 is a side view mainly showing the transport sections 122, 132, 163 of FIG. 1. As shown in FIG. 4, the transport section 122 has an upper transport chamber 125 and a lower transport chamber 126. The transport section 132 has an upper transport chamber 135 and a lower transport chamber 136. The upper transport chamber 125 is provided with the transport mechanism 127, and the lower transport chamber 126 is provided with the transport mechanism 128. Further, the upper transport chamber 135 is provided with the transport mechanism 137, and the lower transport chamber 136 is provided with the transport mechanism 138.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling platforms P-CP are provided in the transport section 163 to be adjacent to the carry-in carry-out block 14B.

The transport mechanism 127 is configured to be capable of transporting the substrates W among the substrate platforms PASS1, PASS2, PASS5, PASS6, the coating processing chambers 21, 22 (FIG. 2) and the upper thermal processing section 301 (FIG. 3). The transport mechanism 128 is configured to be capable of transporting the substrates W among the substrate platforms PASS3, PASS4, PASS7, PASS8, the coating processing chambers 23, 24 (FIG. 2) and the lower thermal processing section 302 (FIG. 3).

The transport mechanism 137 is configured to be capable of transporting the substrates W among the substrate platforms PASS5, PASS6, the placement buffer unit P-BF1, the development processing chamber 31 (FIG. 2), the coating processing chamber 32 (FIG. 2) and the upper thermal processing section 303 (FIG. 3). The transport mechanism 138 is configured to be capable of transporting the substrates W among the substrate platforms PASS7, PASS8, the placement buffer unit P-BF2, the development processing chamber 33 (FIG. 2), the coating processing chamber 34 (FIG. 2), and the lower thermal processing section 304 (FIG. 3).

The transport mechanism 141 of the transport section 163 (FIG. 1) is configured to be capable of transporting the substrate W among the placement cooling platform P-CP, the substrate platform PASS9, the placement buffer units P-BF1, P-BF2, and the cleaning drying processing section 161 (FIG. 2).

The transport mechanism 142 of the transport section 163 (FIG. 1) is configured to be capable of transporting the substrate W among the placement cooling platform P-CP, the substrate platform PASS9, the placement buffer units P-BF1, P-BF2, the cleaning drying processing section 162 (FIG. 3), the upper thermal processing section 303 (FIG. 3) and the lower thermal processing section 304 (FIG. 3).

(5) Operation of Substrate Processing Apparatus

The operation of the substrate processing apparatus 100 will be described with reference to FIGS. 1 to 4. The carriers 113 in which the unprocessed substrates W are stored are placed on the carrier platforms 111 (FIG. 1) in the indexer block 11. The transport mechanism 115 transports the unprocessed substrate W from the carrier 113 to each of the substrate platforms PASS1, PASS3 (FIG. 4). Further, the transport mechanism 115 transports the processed substrate W that is placed on each of the substrate platforms PASS2, PASS4 (FIG. 4) to the carrier 113.

In the first processing block 12, the transport mechanism 127 (FIG. 4) sequentially transports the substrate W placed on the substrate platform PASS1 to the adhesion reinforcement processing unit PAHP (FIG. 3), the cooling unit CP (FIG. 3) and the coating processing chamber 22 (FIG. 2). Next, the transport mechanism 127 sequentially transports the substrate W on which the anti-reflection film is formed by the coating processing chamber 22 to the thermal processing unit PHP (FIG. 3), the cooling unit CP (FIG. 3) and the coating processing chamber 21 (FIG. 2). Then, the transport mechanism 127 sequentially transports the substrate W on which the resist film is formed by the coating processing chamber 21 to the thermal processing unit PHP (FIG. 3) and the substrate platform PASS5 (FIG. 4).

In this case, after the adhesion reinforcement processing is performed on the substrate W in the adhesion reinforcement processing unit PAHP, the substrate W is cooled to a temperature suitable for formation of the anti-reflection film in the cooling unit CP. Next, the anti-reflection film is formed on the substrate W by the coating processing unit 129 (FIG. 2) in the coating processing chamber 22. Subsequently, after the thermal processing for the substrate W is performed in the thermal processing unit PHP, the substrate W is cooled to a temperature suitable for the formation of the resist film in the cooling unit CP. Next, in the coating processing chamber 21, the resist film is formed on the substrate W by the coating processing unit 129 (FIG. 2). Thereafter, the thermal processing for the substrate W is performed in the thermal processing unit PHP, and the substrate W is placed on the substrate platform PASS5.

Further, the transport mechanism 127 transports the substrate W after the development processing that is placed on the substrate platform PASS6 (FIG. 4) to the substrate platform PASS2 (FIG. 4).

The transport mechanism 128 (FIG. 4) sequentially transports the substrate W placed on the substrate platform PASS3 to the adhesion reinforcement processing unit PAHP (FIG. 3), the cooling unit CP (FIG. 3) and the coating processing chamber 24 (FIG. 2). Then, the transport mechanism 128 sequentially transports the substrate W on which the anti-reflection film is formed by the coating processing chamber 24 to the thermal processing unit PHP (FIG. 3), the cooling unit CP (FIG. 3) and the coating processing chamber 23 (FIG. 2). Subsequently, the transport mechanism 128 sequentially transports the substrate W on which the resist film is formed by the coating processing chamber 23 to the thermal processing unit PHP (FIG. 3) and the substrate platform PASS7 (FIG. 4).

Further, the substrate mechanism 128 (FIG. 4) transports the substrate W after the development processing that is placed on the substrate platform PASS8 (FIG. 4) to the substrate platform PASS4 (FIG. 4). The processing contents for the substrate W in each of the coating processing chambers 23, 24 (FIG. 2) and the lower thermal processing section 302 (FIG. 3) are similar to the processing contents for the substrate W in each of the above-mentioned coating processing chambers 21, 22 (FIG. 2) and upper thermal processing section 301 (FIG. 3).

In the second processing block 13, the transport mechanism 137 (FIG. 4) sequentially transports the substrate W after the resist film formation that is placed on the substrate platform PASS5 to the coating processing chamber 32 (FIG. 2), the thermal processing unit PHP (FIG. 3), the edge exposure unit EEW (FIG. 3) and the placement buffer unit P-BF1 (FIG. 4). In this case, in the coating processing chamber 32, the resist cover film is formed on the substrate W by the coating processing unit 129 (FIG. 2). Thereafter, the thermal processing is performed on the substrate W in the thermal processing unit PHP, and the substrate W is carried into the edge exposure unit EEW. Subsequently, in the edge exposure unit EWW, the edge exposure processing is performed on the substrate W. The substrate W after the edge exposure processing is placed on the placement buffer unit P-BF1.

Further, the transport mechanism 137 (FIG. 4) takes out the substrate W after the exposure processing by the exposure device 15 and the thermal processing from the thermal processing unit PHP (FIG. 3) that is adjacent to the cleaning drying processing block 14A. The transport mechanism 137 sequentially transports the substrate W to the cooling unit CP (FIG. 3), the development processing chamber 31 (FIG. 2), the thermal processing unit PHP (FIG. 3) and the substrate platform PASS6 (FIG. 4).

In this case, after the substrate W is cooled to a temperature suitable for the development processing in the cooling unit CP, the resist cover film is removed, and the development processing for the substrate W is performed by the development processing unit 139 in the development processing chamber 31. Thereafter, the thermal processing for the substrate W is performed in the thermal processing unit PHP, and the substrate W is placed on the substrate platform PASS6.

The transport mechanism 138 (FIG. 4) sequentially transports the substrate W after the resist film formation that is placed on the substrate platform PASS7 to the coating processing chamber 34 (FIG. 2), the thermal processing unit PHP (FIG. 3), the edge exposure unit EEW (FIG. 3) and the placement buffer unit P-BF2 (FIG. 4).

Further, the transport mechanism 138 (FIG. 4) takes out the substrate W after the exposure processing by the exposure device 15 and the thermal processing from the thermal processing unit PHP (FIG. 3) that is adjacent to the cleaning drying processing block 14A. The transport mechanism 138 sequentially transports the substrate W to the cooling unit CP (FIG. 3), the development processing chamber 33 (FIG. 2), the thermal processing unit PHP (FIG. 3) and the substrate platform PASS8 (FIG. 4). The processing contents for the substrate W in the development processing chamber 33, the coating processing chamber 34 and the lower thermal processing section 304 are similar to the processing contents for the substrate W in the above-mentioned development processing chamber 31, the coating processing chamber 32 (FIG. 2), and upper thermal processing section 303 (FIG. 3).

In the cleaning drying processing block 14A, the transport mechanism 141 (FIG. 1) transports the substrate W that is placed on each of the placement buffer units P-BF1, P-BF2 (FIG. 4) to the cleaning drying processing unit SD1 (FIG. 2) in the cleaning drying processing section 161. Then, the transport mechanism 141 transports the substrate W from the cleaning drying processing unit SD1 to the placement cooling platform P-CP (FIG. 4). In this case, after the cleaning and drying processing for the substrate W are performed in the cleaning drying processing unit SD1, the substrate W is cooled in the placement cooling platform P-CP to a temperature suitable for the exposure processing in the exposure device 15 (FIG. 1).

The transport mechanism 142 (FIG. 1) transports the substrate W after the exposure processing that is placed on the substrate platform PASS9 (FIG. 4) to the cleaning drying processing unit SD2 (FIG. 3) in the cleaning drying processing section 162. Further, the transport mechanism 142 transports the substrate W after the cleaning and drying processing to the thermal processing unit PHP (FIG. 3) in the upper thermal processing section 303 or the thermal processing unit PHP (FIG. 3) in the lower thermal processing section 304 from the cleaning drying processing unit SD2. In this thermal processing unit PHP, post-exposure bake (PEB) processing is performed.

In the carry-in carry-out block 14B, the transport mechanism 146 (FIG. 1) transports the substrate W before the exposure processing that is placed on the placement cooling platform P-CP (FIG. 4) to the substrate inlet 15a (FIG. 1) of the exposure device 15. Further, the transport mechanism 146 (FIG. 1) takes out the substrate W after the exposure processing from the substrate outlet 15b (FIG. 1) of the exposure device 15, and transports the substrate W to the substrate platform PASS9 (FIG. 4).

In the case where the exposure device 15 cannot receive the substrate W, the substrate W before the exposure processing is temporarily stored in each of the placement buffer units P-BF1, P-BF2. Further, in the case where the development processing unit 139 (FIG. 2) in the second processing block 13 cannot receive the substrate W after the exposure processing, the substrate W after the exposure processing is temporarily stored in each of the placement buffer units P-BF1, P-BF2.

In the present embodiment, processing for the substrate W in the coating processing chambers 21, 22, 32, the development processing chamber 31 and the upper thermal processing sections 301, 303 that are provided above, and the processing for the substrate W in the coating processing chambers 23, 24, 34, the development processing chamber 33, and the lower thermal processing sections 302, 304 that are provided below can be concurrently performed. Thus, it is possible to improve throughput without increasing a footprint.

(6) Configuration of Cleaning Drying Processing Units

In the present invention, an upper surface of the substrate W refers to a surface of the substrate W directed upward, and a lower surface of the substrate W refers to a surface of the substrate W directed downward. Further, a main surface of the substrate W refers to a surface on which an anti-reflection film, a resist film and a resist cover film are formed, and a back surface of the substrate W refers to the opposite surface. Inside of the substrate processing apparatus 100 according to the present embodiment, with the main surface of the substrate W being directed upward, each type of above-mentioned processing is performed on the substrate W. Therefore, in the present embodiment, the main surface of the substrate W is equivalent to the upper surface of the substrate of the present invention, and the back surface of the substrate W is equivalent to the lower surface of the substrate of the present invention.

Figure 5:
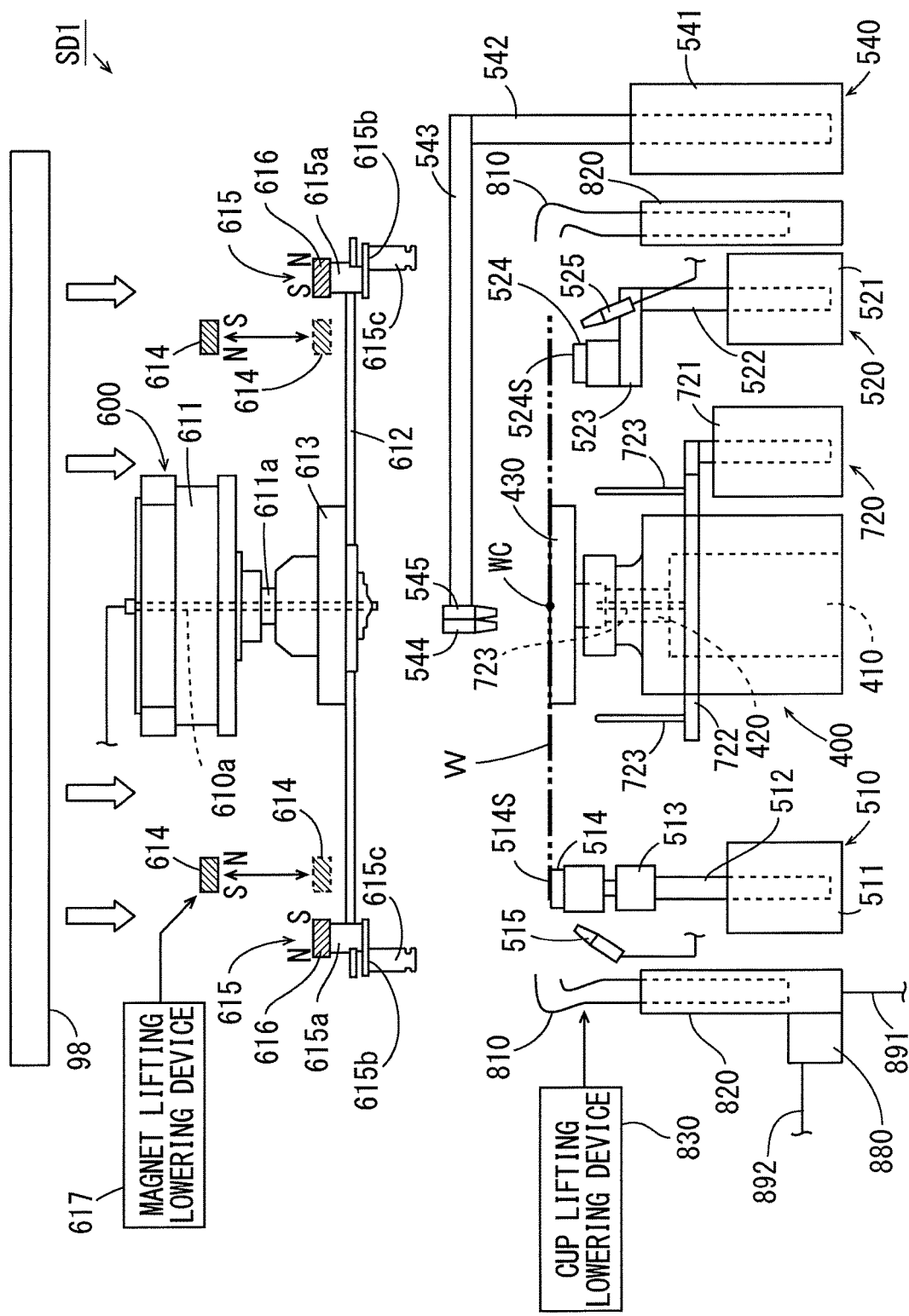
FIG. 5 is a side view showing the configuration of a cleaning drying processing unit.
Figure 6:
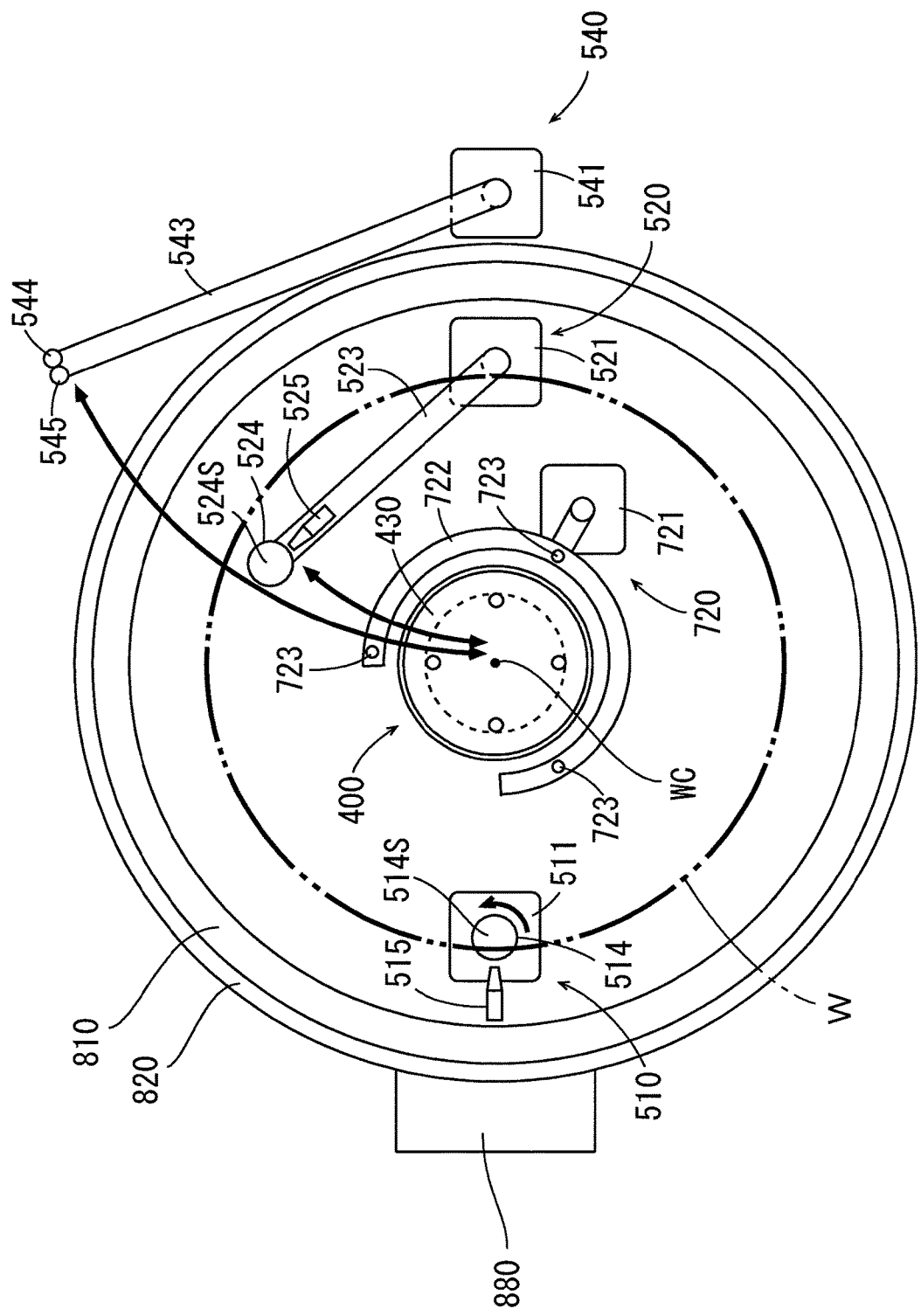
FIG. 6 is a schematic plan view for explaining the configuration of a lower spin chuck and its peripheral members used in a cleaning drying processing unit of FIG. 5.

FIG. 5 is a side view showing the configuration of the cleaning drying processing unit SD1, and FIG. 6 is a schematic plan view for explaining the configuration of a lower spin chuck 400 and its peripheral members used in the cleaning drying processing unit SD1 of FIG. 5. In each of FIGS. 5 and 6, the substrate W held by the lower spin chuck 400 is indicated by a thick two-dots and dash line. FIG. 7 is a schematic plan view for explaining the configuration of an upper spin chuck 600 used in the cleaning drying processing unit SD1 of FIG. 5. In FIG. 7, part of the constituent elements of the upper spin chuck 600 is schematically shown, and the substrate W held by the upper spin chuck 600 is indicated by a thick two-dots and dash line.

As shown in FIG. 5, the cleaning drying processing unit SD1 is provided below the air supply unit 98. Thus, as indicated by outlined arrows in FIG. 5, a downflow of clean air is formed in a space surrounding the cleaning drying processing unit SD1. Further, the cleaning drying processing unit SD1 includes the lower spin chuck 400 and the upper spin chuck 600. The upper spin chuck 600 is provided above the lower spin chuck 400.

The lower spin chuck 400 includes a spin motor 410 and a suction holder 430. The spin motor 410 is provided at the bottom of the cleaning drying processing unit SD1, for example. In the spin motor 410, a rotation shaft 420 is provided to extend upward. The suction holder 430 is provided at the upper end of the rotation shaft 420. The suction holder 430 is configured to be capable of sucking a center portion of the back surface of the substrate W. The suction holder 430 sucks the center portion of the back surface of the substrate W to hold the substrate W.

As shown in FIGS. 5 and 6, a first back surface cleaning mechanism (a first back surface cleaning robot) 510, a second back surface cleaning mechanism (a second back surface cleaning robot) 520, a main surface cleaning mechanism (a main surface cleaning robot) 540 and a receiving transferring mechanism (a receiving transferring robot) 720 are provided outside of the lower spin chuck 400.

The receiving transferring mechanism 720 is provided to be close to the lower spin chuck 400. The receiving transferring mechanism 720 includes a lifting lowering driver 721, a pin support member (a pin supporter) 722, and a plurality (three in the present example) of lifting lowering pins 723. The pin support member 722 is attached to the lifting lowering driver 721. The lifting lowering driver 721 supports the pin support member 722 to be movable in the vertical direction. The plurality of lifting lowering pins 723 are attached to the pin support member 722 to respectively extend in the vertical direction. The plurality of lifting lowering pins 723 are arranged to surround the lower spin chuck 400 at equal intervals. The upper ends of the plurality of lifting lowering pins 723 abut against a region between the center portion of the back surface of the substrate W and the peripheral portion of the back surface of the substrate W to support the substrate W in a horizontal attitude.

The receiving transferring mechanism 720 is controlled by the controller 114 of FIG. 1. The pin support member 722 is moved in the vertical direction by an operation of the receiving transferring mechanism 720. Thus, the upper ends of the plurality of lifting lowering pins 723 are moved among three heights L1, L2 and L3 (see FIG. 10), described below.

The first back surface cleaning mechanism 510 includes a lifting lowering driver 511, a lifting lowering shaft 512, a brush motor 513, a brush 514, and a nozzle 515. The lifting lowering shaft 512 is attached to the lifting lowering driver 511 to extend in the vertical direction. The lifting lowering driver 511 supports the lifting lowering shaft 512 to be movable in the vertical direction. The brush motor 513 is provided at the upper end of the lifting lowering shaft 512. The brush 514 is attached to the brush motor 513. The brush motor 513 supports the brush 514 to be rotatable about a vertical axis. The brush 514 has a cleaning surface 514S directed upward.

The lifting lowering driver 511 moves the lifting lowering shaft 512 in the vertical direction. Thus, the height of the brush 514 changes. Further, the brush motor 513 drives the brush 514. Thus, the brush 514 is rotated about the vertical axis. A cleaning liquid supply system (a cleaning liquid supplier) (not shown) is connected to the nozzle 515. The nozzle 515 is configured to be capable of discharging a cleaning liquid supplied from the cleaning liquid supply system to the brush 514.

As shown in FIG. 6, in the case where the lower spin chuck 400 is viewed from above, the first back surface cleaning mechanism 510 is arranged such that the cleaning surface 514S of the brush 514 overlaps with the outer peripheral portion and the outer peripheral end of the substrate W held by the lower spin chuck 400. The first back surface cleaning mechanism 510 is controlled by the controller 114 of FIG. 1.

As shown in FIGS. 5 and 6, the second back surface cleaning mechanism 520 includes a lifting lowering rotation driver 521, a lifting lowering rotation shaft 522, an arm 523, a brush 524 and a nozzle 525. The lifting lowering rotation shaft 522 is attached to the lifting lowering rotation driver 521 to extend in the vertical direction. The lifting lowering rotation driver 521 supports the lifting lowering rotation shaft 522 to be movable in the vertical direction and rotatable about a vertical axis. The arm 523 is coupled to the upper end of the lifting lowering rotation shaft 522 to extend in a horizontal direction. The brush 524 is attached to the tip end of the arm 523. The brush 524 has a cleaning surface 524S directed upward.

The lifting lowering rotation driver 521 moves the lifting lowering rotation shaft 522 in the vertical direction. Thus, the height of the brush 524 changes. Further, the lifting lowering rotation driver 521 rotates the lifting lowering rotation shaft 522. Thus, the brush 524 moves between a position directly upward of a rotation center WC of the suction holder 430 and a position outside of the lower spin chuck 400, for example.

The nozzle 525 is attached to a position in the vicinity of the tip end of the arm 523. The cleaning liquid supply system (not shown) is connected to the nozzle 525. The nozzle 525 is configured to be capable of discharging a cleaning liquid supplied from the cleaning liquid supply system to the brush 524. The second back surface cleaning mechanism 520 is controlled by the controller 114 of FIG. 1.

As each of the above-mentioned brushes 514, 524, a sponge brush made of polyvinyl alcohol, for example, is used.

As shown in FIGS. 5 and 6, the main surface cleaning mechanism 540 includes a lifting lowering rotation driver 541, a lifting lowering rotation shaft 542, an arm 543 and nozzles 544, 545. The lifting lowering rotation shaft 542 is attached to the lifting lowering rotation driver 541 to extend in the vertical direction. The lifting lowering rotation driver 541 supports the lifting lowering rotation shaft 542 to be movable in the vertical direction and rotatable about a vertical axis. The arm 543 is coupled to the upper end of the lifting lowering rotation shaft 542 to extend in the horizontal direction. The nozzles 544, 545 are attached to the tip end of the arm 543.

The lifting lowering rotation driver 541 moves the lifting lowering rotation shaft 542 in the vertical direction. Thus, the height of each of the nozzles 544, 545 changes. Further, the lifting lowering rotation driver 541 rotates the lifting lowering rotation shaft 542. Thus, the nozzles 544, 545 are moved between a position directly upward of the rotation center WC of the suction holder 430 and a position outside of the lower spin chuck 400 in a horizontal plane.

The cleaning liquid supply system (not shown) is connected to the nozzle 544. The nozzle 544 is configured to be capable of downwardly discharging a cleaning liquid supplied from the cleaning liquid supply system. A gas supply system (a gas supplier) (not shown) is connected to the nozzle 545. The nozzle 545 is configured to be capable of downwardly discharging the gas supplied from the gas supply system. As the gas supplied to the nozzle 545, an inert gas such as a nitrogen gas is used. The main surface cleaning mechanism 540 is controlled by the controller 114 of FIG. 1.

As shown in FIGS. 5 and 7, the upper spin chuck 600 includes a spin motor 611, a disc-shape spin plate 612, a plate support member (a plate supporter) 613, a magnet plate 614 and a plurality of chuck pins 615.

The spin motor 611 is supported by a support member (a supporter) (not shown) at a position above the lower spin chuck 400. In the spin motor 611, a rotation shaft 611a is provided to extend downward. The plate support member 613 is attached to the lower end of the rotation shaft 611a. The spin plate 612 is horizontally supported by the plate support member 613. The spin motor 611 rotates the rotation shaft 611a. Thus, the spin plate 612 rotates about a vertical axis. The rotation shaft 611a of the upper spin chuck 600 is arranged on an extending line of the rotation shaft 420 of the lower spin chuck 400.

A liquid supply pipe 610a is inserted into the spin motor 611, the rotation shaft 611a and the plate support member 613. A cleaning liquid can be discharged to the main surface of the substrate W held by the upper spin chuck 600 through the liquid supply pipe 610a.

A plurality (five in the present example) of chuck pins 615 are provided at the peripheral portions of the spin plate 612 at equal angular intervals with respect to the rotation shaft 611a. The number of chuck pins 615 is preferably 5 or more.

Each chuck pin 615 includes a shaft portion (a shaft) 615a, a pin supporter 615b, a holder 615c and a magnet 616. The shaft portion 615a is provided to penetrate the spin plate 612, and the pin supporter 615b extending in the horizontal direction is connected to the lower end of the shaft portion 615a. The holder 615c is provided to project downward from the tip end of the pin supporter 615b. Further, the magnet 616 is attached to the upper end of the shaft portion 615a on the upper surface side of the spin plate 612.

Each spin chuck 615 is rotatable about the shaft portion 615a, and the holder 615c can be switched between a close state of abutting against the outer peripheral end of the substrate W and an open state of spacing apart from the outer peripheral end of the substrate W. In the present example, each chuck pin 615 enters the close state in the case where an N pole of the magnet 616 is on the inner side, and each chuck pin 615 enters the open state in the case where an S pole of the magnet 616 is on the inner side.

An annular magnet plate 614 is arranged above the spin plate 612 to extend in a circumferential direction about the rotation shaft 611a. The magnet plate 614 has an S pole on the outer side, and has an N pole on the inner side. The magnet plate 614 is lifted and lowered by a magnet lifting lowering device (a magnet lifter-lowerer) 617, and is moved between an upper position higher than the magnet 616 of the chuck pin 615 and a lower position substantially the equal height as the magnet 616 of the chuck pin 615.

Each chuck pin 615 is switched between the open state and the close state by lifting and lowering of the magnet plate 614. Specifically, in the case where the magnet plate 614 is at the upper position, each chuck pin 615 enters the open state. On the one hand, in the case where the magnet plate 614 is at the lower position, each chuck pin 615 enters the close state.

As the cleaning liquid discharged from the above-mentioned nozzles 515, 525, 544 and the liquid supply pipe 610a, pure water, a pure water solution containing a complex, a fluorine-based chemical solution or the like is used. Further, as the cleaning liquid, an immersion liquid used for the exposure processing in the exposure device 15 may be used.

As shown in FIGS. 5 and 6, a splash prevention cup 810, a storage member (a storage) 820, a cup lifting lowering device (a cup lifter-lowerer) 830 and a gas discharge space formation member (a gas discharge space former) 880 are provided outside of the lower spin chuck 400, the first back surface cleaning mechanism 510, the second back surface cleaning mechanism 520 and the receiving transferring mechanism 720.

As shown in FIGS. 6 and 7, the splash prevention cup 810 is provided to surround a space including the substrate W held by the lower spin chuck 400 or the upper spin chuck 600. In the following description, the substrate W held by the lower spin chuck 400 or the upper spin chuck 600 and a space lower than the substrate W are referred to as an inner space.

As shown in FIG. 5, a lower portion of the splash prevention cup 810 is stored in the storage member 820 to be movable in the up-and-down direction. The cup lifting lowering device 830 moves the splash prevention cup 810 in the up-and-down direction relative to the storage member 820. The gas discharge space formation member 880 is integrally provided at a side portion of the storage member 820. Details of the splash prevention cup 810, the storage member 820 and the gas discharge space formation member 880 will be described below.

One end of a liquid discharge pipe 891 is connected to the bottom of the storage member 820. The other end of the liquid discharge pipe 891 is connected to a liquid discharge system (a liquid discharger) in the factory. One end of a gas discharge pipe 892 is connected to the gas discharge space formation member 880. The other end of the gas discharge pipe 892 is connected to the gas discharge system in the factory.

(7) Details of Configurations of Splash Prevention Cup and Storage Member

Figure 8:
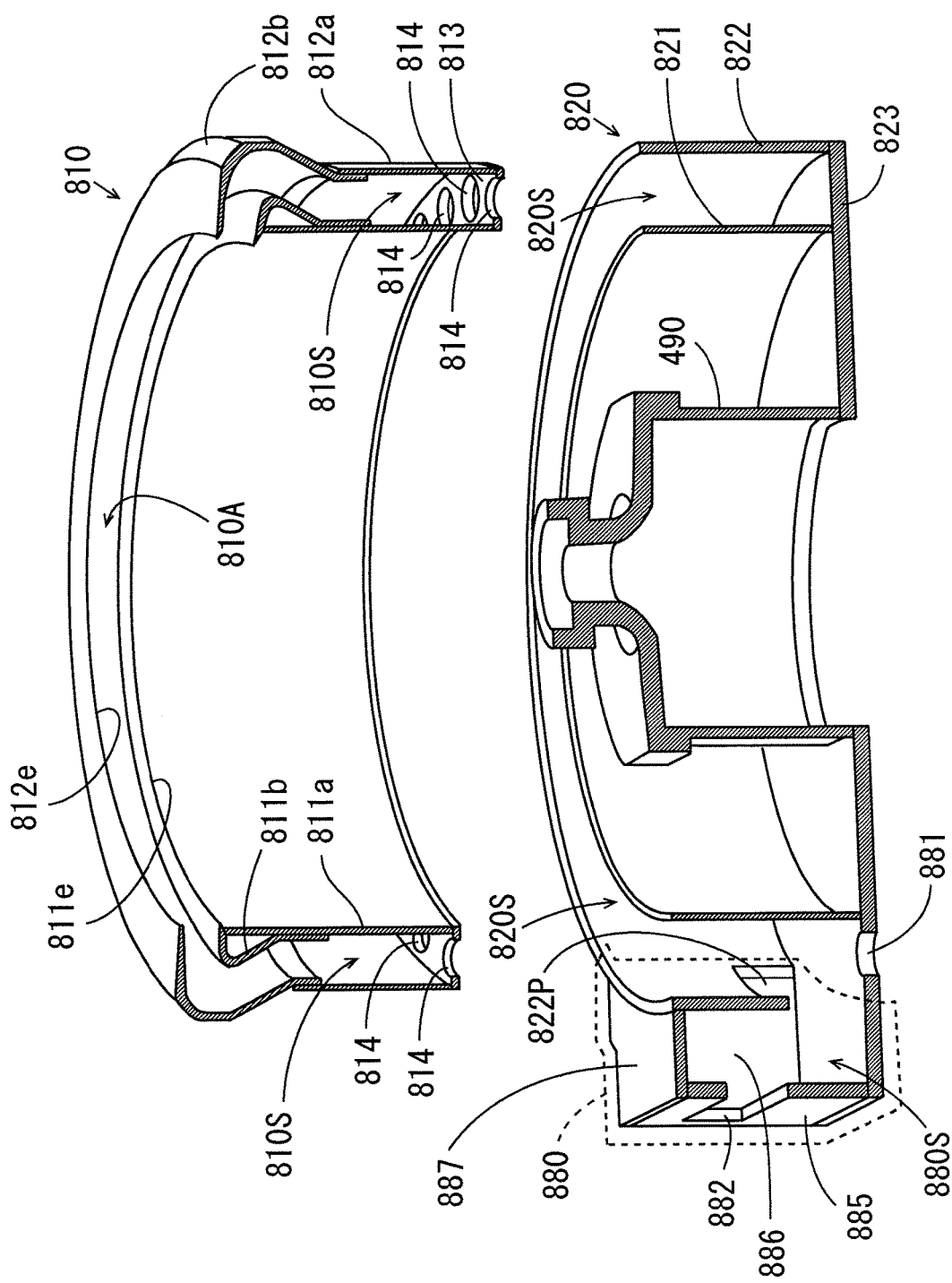
FIG. 8 is a partial cutaway perspective view showing the configuration of a splash prevention cup, a storage member and a gas discharge space formation member.
Figure 9:
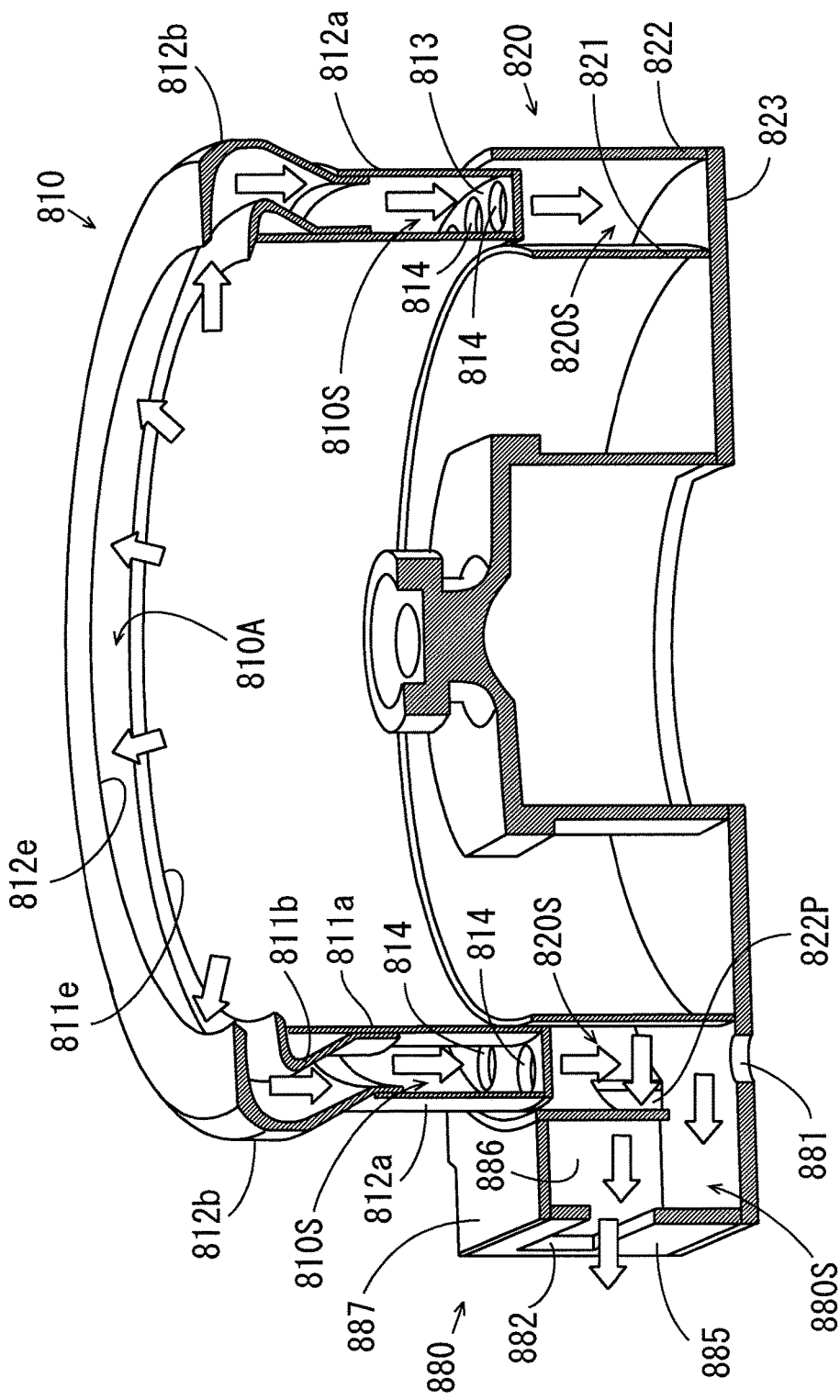
FIG. 9 is a partial cutaway perspective view showing the configuration of the splash prevention cup, the storage member, and the gas discharge space formation member.

FIGS. 8 and 9 are partial cutaway perspective views showing the configurations of the splash prevention cup 810, the storage member 820 and the gas discharge space formation member 880. In FIG. 8, the splash prevention cup 810 and the storage member 820 being separated from each other are shown. In FIG. 9, a lower portion of the splash prevention cup 810 being stored in the storage member 820 is shown.

As shown in FIG. 8, the splash prevention cup 810 is mainly constituted by a first inner wall member (a first inner wall) 811a, an inner upper member 811b, a first outer wall member (a first outer wall) 812a, an outer upper member 812b and an annular plate member (an annular plate) 813.

The first inner wall member 811a has a cylindrical shape extending in the vertical direction. An inner diameter of the first inner wall member 811a is larger than the diameter of the substrate W. The first outer wall member 812a has a cylindrical shape extending in the vertical direction, and is provided to surround the outside of the first inner wall member 811a.

The annular plate member 813 has the inner diameter same as the inner diameter of the first inner wall member 811a, and has the outer diameter same as the outer diameter of the first outer wall member 812a. A plurality of communication holes 814 are dispersively arranged in the circumferential direction in the annular plate member 813. The annular plate member 813 couples the lower end of the first inner wall member 811a to the lower end of the first outer wall member 812a such that a first annular space 810S is formed between the first inner wall member 811a and the first outer wall member 812a. In this state, the upper end of the first outer wall member 812a is located at a position lower than the upper end of the first inner wall member 811a.

A lower portion of the annular outer upper member 812b is joined to part of the inner peripheral surface of the first outer wall member 812a. The outer upper member 812b is formed to be curved outward and upward from the upper end of the first outer wall member 812a, and further curved inward to cover the upper portion of the first annular space 810S. An upper-end inner-edge 812e of the outer upper member 812b is located above the first inner wall member 811a.

A lower portion of the annular inner upper member 811b is joined to part of the outer peripheral surface of the first inner wall member 811a. The inner upper member 811b is curved outward and upward from a portion, opposite to the upper end of the first outer wall member 812a, of the outer peripheral surface of the first inner wall member 811a, and further curved inward. An upper-end inner-edge 811e of the inner upper member 811b is joined to the upper end of the first inner wall member 811a.

In the splash prevention cup 810, an annular opening 810A is formed between the upper-end inner-edge 812e of the outer upper member 812b and the upper-end inner-edge 811e of the inner upper member 811b. In this case, the upper-end inner-edge 812e of the outer upper member 812b forms an upper edge of the annular opening 810A, and the upper-end inner-edge 811e of the inner upper member 811b forms a lower edge of the annular opening 810A.

The annular opening 810A is formed to be able to be opposite to the outer peripheral end of the substrate W held by the lower spin chuck 400 or the upper spin chuck 600, and connects the inner space including the substrate W to the first annular space 810S.

The inner upper member 811b does not have to be provided. In this case, the annular opening 810A is formed between the upper-end inner-edge 812e of the outer upper member 812b and the upper end of the first inner wall member 811a.

The storage member 820 is mainly constituted by part of a bottom plate 823, a second inner wall member (a second inner wall) 821 and a second outer wall member (a second outer wall) 822. The second inner wall member 821 and the second outer wall member 822 have a cylindrical shape extending in the vertical direction. An outer diameter of the second inner wall member 821 is slightly smaller than an inner diameter of the first inner wall member 811a of the splash prevention cup 810. An inner diameter of the second outer wall member 822 is slightly larger than an outer diameter of the first outer wall member 812a of the splash prevention cup 810.

A motor cover 490 for storing the spin motor 410 (FIG. 5) of the lower spin chuck 400 (FIG. 5) is attached to substantially the center portion of the bottom plate 823. The lower end of the second inner wall member 821 is joined to the upper surface of the bottom plate 823 to surround the motor cover 490. The lower end of the second outer wall member 822 is joined to the upper surface of the bottom plate 823 to surround the outside of the second inner wall member 821. In this state, a second annular space 820S is formed between the second inner wall member 821 and the second outer wall member 822.

A liquid discharge port 881 is formed at part of a region opposite to the second annular space 820S of the bottom plate 823. The liquid discharge pipe 891 of FIG. 5 is connected to the liquid discharge port 881.

A first opening 822P is formed at a lower portion of the second outer wall member 822. The opening 822P is formed to extend in the circumferential direction along the lower edge of the second outer wall member 822 for a constant length.

The gas discharge space formation member 880 is formed to surround a space coming into contact with a partial region of the outer peripheral surface of the second outer wall member 822 as a gas discharge space 880S. Specifically, the gas discharge space formation member 880 includes one first plate member (a first plate) 885, two second plate members (second plates) 886, and one third plate member (a third plate) 887. The first plate member 885 and the second plate members 886 are rectangular, respectively. In each of FIGS. 8 and 9, only one of the two second plate members 886 is shown.

The first plate member 885 is joined to the upper surface of the bottom plate 823 at a position outside of the second outer wall member 822 to be opposite to the first opening 822P and parallel to the vertical direction. The two second plate members 886 are joined to the upper surface of the bottom plate 823 to respectively connect two portions, sandwiching the first opening 822P in the circumferential direction, of the outer peripheral surface of the second outer wall member 822 to both side portions of the first plate member 885.

The third plate member 887 is joined to the first plate member 885, the second plate members 886 and the second outer wall member 822 to close the gas discharge space 880S surrounded by the first plate member 885, the second plate members 886 and the outer peripheral surface of the second outer wall member 822 from above.

A second opening 882 is formed at a portion slightly higher than the center portion of the first plate member 885. The second opening 882 is located at a position higher than the first opening 822P. The gas discharge pipe 892 of FIG. 5 is connected to the second opening 882.

As shown in FIG. 9, with the lower portion of the splash prevention cup 810 being stored in the second annular space 820S of the storage member 820, the splash prevention cup 810 is supported to be movable upward and downward by the cup lifting lowering device 830 of FIG. 5. In this state, the first annular space 810S of the splash prevention cup 810 communicates with the second annular space 820S of the storage member 820 through the plurality of communication holes 814 of the annular plate member 813. Further, the second annular space 820S communicates with the gas discharge space 880S of the gas discharge space formation member 880 through the first opening 822P of the second outer wall member 822.

During the cleaning processing for the substrate W, with the annular opening 810A being opposite to the outer peripheral end of the substrate W rotated by the lower spin chuck 400 or the upper spin chuck 600, the splash prevention cup 810 is held. Further, the cleaning liquid is supplied to the rotating substrate W.

As described above, the gas discharge pipe 892 of FIG. 5 connects the second opening 882 of the gas discharge space formation member 880 to the gas discharge system in the factory. In this case, as indicated by outlined arrows in FIG. 9, the gas in the inner space is sucked by the gas discharge pipe 892 of FIG. 5 through the annular opening 810A, the first annular space 810S and the second annular space 820S. Thus, a flow of gas flowing from the outer peripheral end of the rotating substrate W towards the annular opening 810A is formed. At this time, because a flow of gas flowing towards a position below the substrate W through a gap between the outer peripheral end of the substrate W and the annular opening 810A is shielded, occurrence of turbulence in the inner space is prevented.

Splashes and a mist of the cleaning liquid splashed outward from the outer peripheral end of the rotating substrate W are drawn into the first annular space 810S from the annular opening 810A together with gas, and led to the gas discharge pipe 892 of FIG. 5 through the second annular space 820S and the gas discharge space 880S. In this case, because the inner space is surrounded by the first inner wall member 811a and the second inner wall member 821, splashes and a mist of the cleaning liquid drawn into the first annular space 810S are prevented from returning to the space on the back surface side of the substrate W. Further, because the splash prevention cup 810 is moved in the up-and-down direction with the lower portion of the splash prevention cup 810 being stored in the storage member 820, gas, and splashes and a mist of the cleaning liquid are prevented from leaking to the inner space from a boundary portion between the first annular space 810S and the second annular space 820S. As a result, the cleaning liquid splashed from the substrate W is prevented from adhering again to the back surface of the substrate W.

Further, during the cleaning processing for the substrate W, a large part of splashes and a mist of the cleaning liquid led to the second annular space 820S is led from the liquid discharge port 881 of the bottom plate 823 to the liquid discharge pipe 891 of FIG. 5 by gravity. On the one hand, the gas led to the second annular space 820S is led to the gas discharge pipe 892 of FIG. 5 through the first opening 822P and the second opening 882. In the above-mentioned configuration, because the second opening 882 is located at a position higher than the first opening 822P, an amount of splashes and a mist of the cleaning liquid led to the gas discharge pipe 892 together with gas is decreased. Therefore, the cleaning liquid can be efficiently collected.

(8) Cleaning Processing and Drying Processing for Substrate by Cleaning Drying Processing Unit A series of operations of each cleaning drying processing unit SD1 for performing cleaning processing for the substrate W is explained. FIGS. 10 to 17 are side views for explaining the cleaning processing for the substrate W by the cleaning drying processing unit SD1. In the following description, the height that is lower than the upper end of the lower spin chuck 400 by a constant distance is referred to as a height L1. Further, a predetermined height between the lower spin chuck 400 and the upper spin chuck 600 is referred to as a height L2. Further, the height at which the substrate W can be held by the upper spin chuck 600 is referred to as a height L3.

Figure 10:
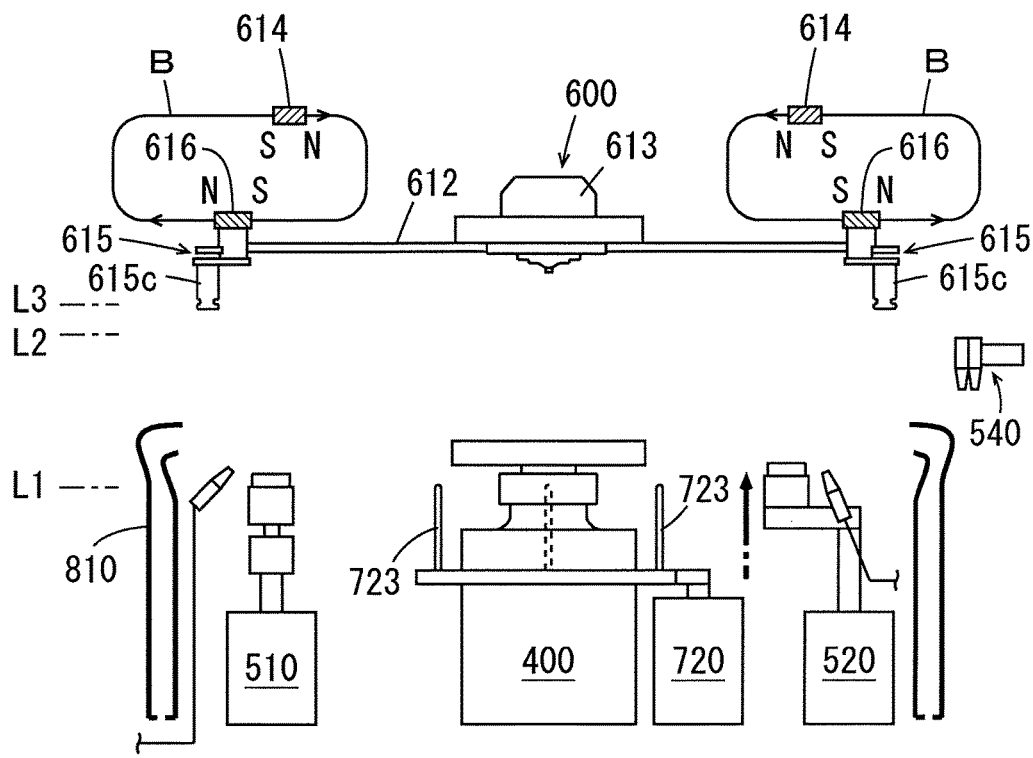
FIG. 10 is a side view for explaining cleaning processing for the substrate by the cleaning drying processing unit.

As shown in FIG. 10, in an initial state, the upper end of the splash prevention cup 810 is held at a position lower than the upper spin chuck 600 and higher than the lower spin chuck 400. Further, the magnet plate 614 of the upper spin chuck 600 is located at the upper position. In this case, a line of magnetic force B of the magnet plate 614 is directed outward at the height of the magnet 616 of the chuck pin 615. Thus, the S pole of the magnet 616 of each chuck pin 615 is attracted inward. Therefore, each chuck pin 615 enters the open state. Further, the upper ends of the plurality of lifting lowering pins 723 of the receiving transferring mechanism 720 are held at the height L1.

Figure 11:
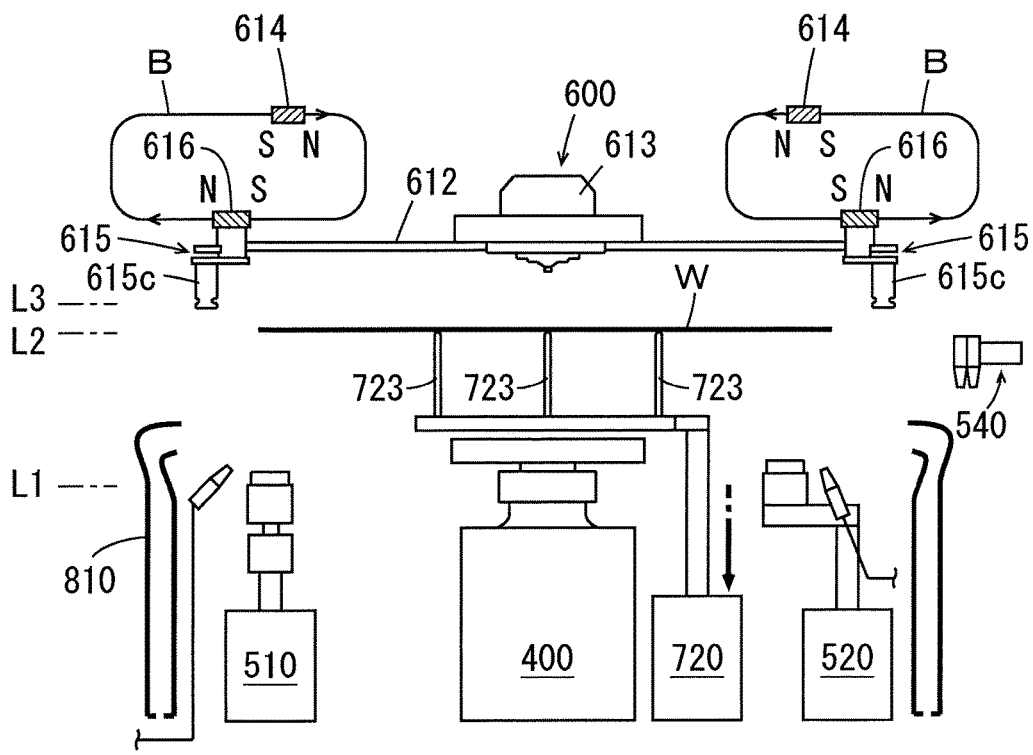
FIG. 11 is a side view for explaining the cleaning processing for the substrate by the cleaning drying processing unit.

When the substrate W is carried into the cleaning drying processing unit SD1, as indicated by a thick one-dot and dash arrow in FIG. 10, the plurality of lifting lowering pins 723 are moved upward. Thus, as shown in FIG. 11, the upper ends of the plurality of lifting lowering pins 723 are held at the height L2. In this state, the substrate W is placed on the plurality of lifting lowering pins 723 by the transport mechanism 141 of FIG. 1.

Figure 12:
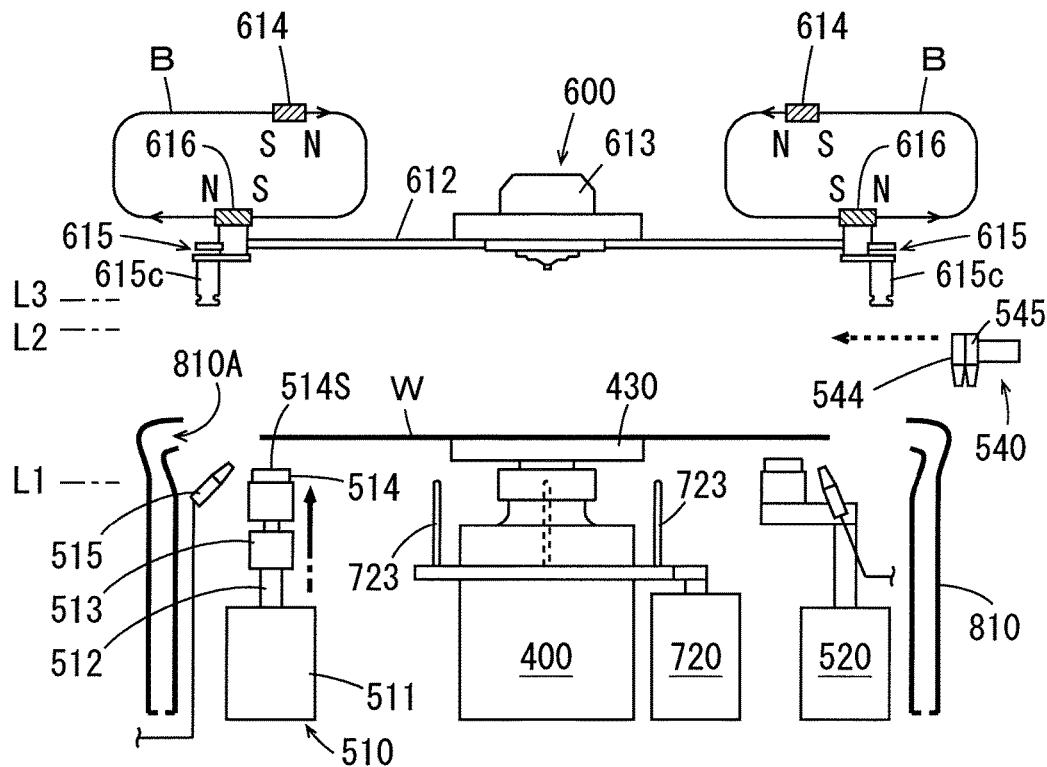
FIG. 12 is a side view for explaining the cleaning processing for the substrate by the cleaning drying processing unit.

Next, as indicated by a thick one-dot and dash arrow in FIG. 11, the plurality of lifting lowering pins 723 are moved downward. Thus, as shown in FIG. 12, the substrate W is transferred onto the suction holder 430 from the plurality of lifting lowering pins 723. At this time, the center of the substrate W is positioned to coincide with the rotation center WC of the suction holder 430 (FIG. 6) in a horizontal plane. Thereafter, the center portion of the back surface of the substrate W is held by the lower spin chuck 400, and the substrate W is rotated. The upper ends of the plurality of lifting lowering pins 723 of the receiving transferring mechanism 720 are held at the height L1. At this time, with the annular opening 810A being opposite to the outer peripheral end of the substrate W, the splash prevention cup 810 is held. The gas in the inner space is sucked into the annular opening 810A, so that a flow of gas flowing from the outer peripheral end of the rotating substrate W towards the annular opening 810A is formed.

Next, as indicated by a thick one-dot and dash arrow in FIG. 12, the brush 514 of the first back surface cleaning mechanism 510 is moved upward. Further, as indicated by a thick dotted arrow in FIG. 12, the nozzles 544, 545 of the main surface cleaning mechanism 540 are moved from a position outside of the lower spin chuck 400 to a position above the substrate W.

Figure 13:
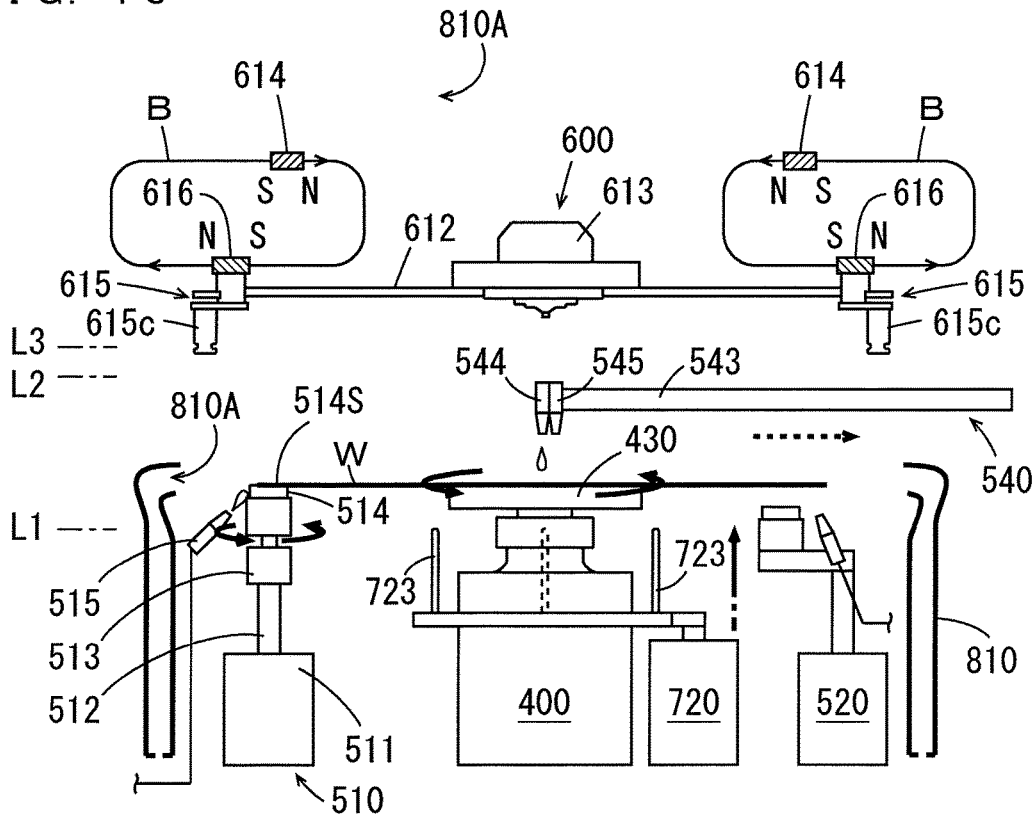
FIG. 13 is a side view for explaining the cleaning processing for the substrate by the cleaning drying processing unit.

Thus, as shown in FIG. 13, the cleaning surface 514S of the brush 514 comes into contact with the peripheral portion of the back surface of the substrate W. At this time, the brush 514 is pressed against the back surface of the substrate W with the pressure based on a predetermined cleaning condition. Further, the brush 514 is rotated by the brush motor 513. Further, the cleaning liquid is discharged from the nozzle 515 to the brush 514. Thus, contaminants at the peripheral portion of the back surface of the substrate W are removed by the brush 514. Further, the contaminants removed by the brush 514 are cleaned away by the cleaning liquid.

At this time, part of the cleaning surface 514S of the brush 514 comes into contact with the outer peripheral end of the substrate W. Thus, the peripheral portion of the back surface of the substrate W, and the outer peripheral end of the substrate W are simultaneously cleaned without another brush.

Further, the nozzle 544 of the main surface cleaning mechanism 540 is held at a position directly upward of the center of the substrate W. In this state, the cleaning liquid is discharged from the nozzle 544 to the main surface of the rotating substrate W. Thus, the main surface of the substrate W is cleaned. The cleaning liquid splashed from the rotating substrate W is sucked into the annular opening 810A together with the gas in the inner space. Thus, the cleaning liquid splashed from the substrate W is prevented from adhering again to the back surface of the substrate W.

When the cleaning for the peripheral portion of the back surface of the substrate W, the outer peripheral end of the substrate W, and the main surface of the substrate W is finished, the first back surface cleaning mechanism 510 returns to the initial state. Specifically, in the first back surface cleaning mechanism 510, the rotation of the brush motor 513 is stopped, the discharge of the cleaning liquid from the nozzle 515 to the brush 514 is stopped, and the brush 514 is moved downward.

On the one hand, in the main surface cleaning mechanism 540, the discharge of the cleaning liquid from the nozzle 544 to the substrate W is stopped, and the nozzle 545 is held at a position directly upward of the center of the substrate W. In this state, gas is discharged to the main surface of the substrate W from the nozzle 545. Thus, the main surface of the substrate W is dried. Also during this drying, the cleaning liquid splashed from the rotating substrate W is sucked into the annular opening 810A together with the gas in the inner space. Thus, the cleaning liquid splashed from the substrate W is prevented from adhering again to the back surface of the substrate W.

When the back surface and the main surface of the substrate W are dried, as indicated by a thick dotted arrow in FIG. 13, the nozzles 544, 545 of the main surface cleaning mechanism 540 are moved from a position directly upward of the substrate W to positions outside of the lower spin chuck 400. Further, the rotation of the substrate W is stopped. Further, suction of the substrate W is stopped in the lower spin chuck 400.

Figure 14:
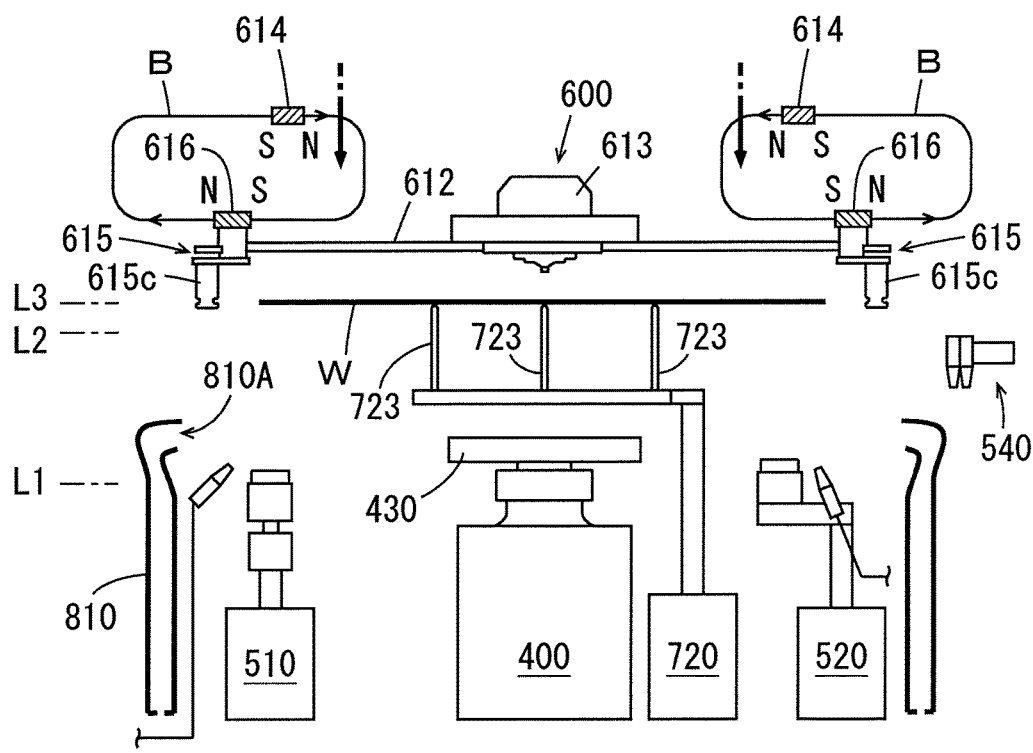
FIG. 14 is a side view for explaining the cleaning processing for the substrate by the cleaning drying processing unit.

Then, as indicated by a thick one-dot and dash arrow in FIG. 13, the plurality of lifting lowering pins 723 are moved upward. Thus, as shown in FIG. 14, the substrate W is transferred from the suction holder 430 of the lower spin chuck 400 onto the plurality of lifting lowering pins 723. Thereafter, the upper ends of the plurality of lifting lowering pins 723 are held at the height L3. At this time, the substrate W is located among the holders 615c of the plurality of chuck pins 615 of the upper spin chuck 600.

Then, as indicated by thick one-dot and dash arrows in FIG. 14, the magnetic plate 614 of the upper spin chuck 600 is moved to the lower position. In this case, the N poles of the magnets 616 of the plurality of chuck pins 615 are attracted inward. Thus, each chuck pin 615 enters the close state, and each holder 615c abuts against the outer peripheral end of the substrate W. Thus, as shown in FIG. 15, the outer peripheral end of the substrate W is held by the holders 615c of the plurality of chuck pins 615.

Figure 15:
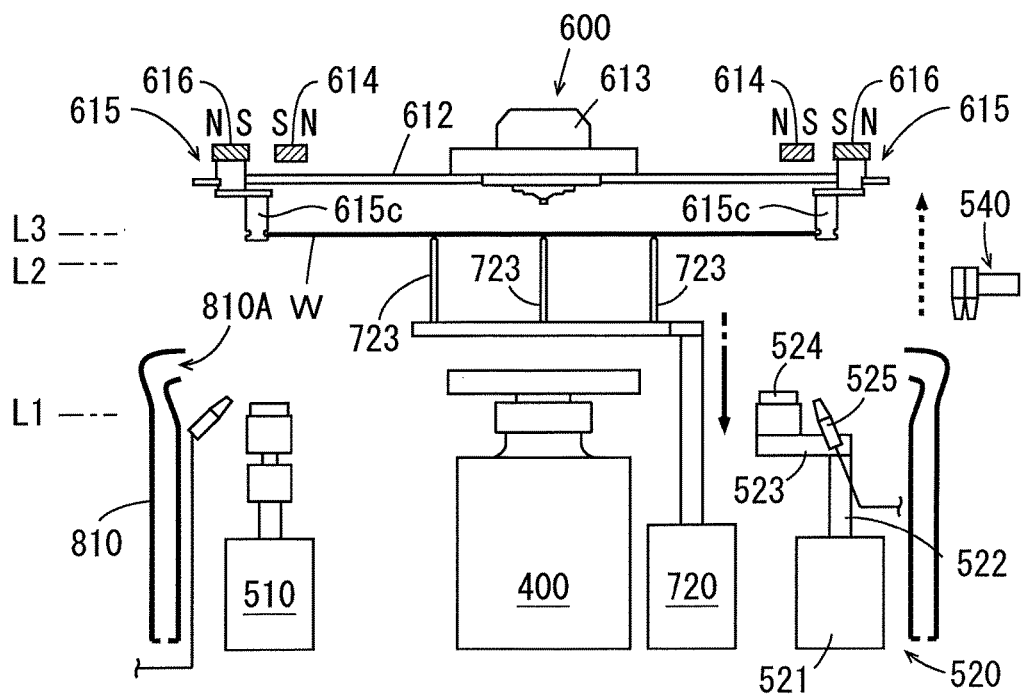
FIG. 15 is a side view for explaining the cleaning processing for the substrate by the cleaning drying processing unit.
Figure 16:
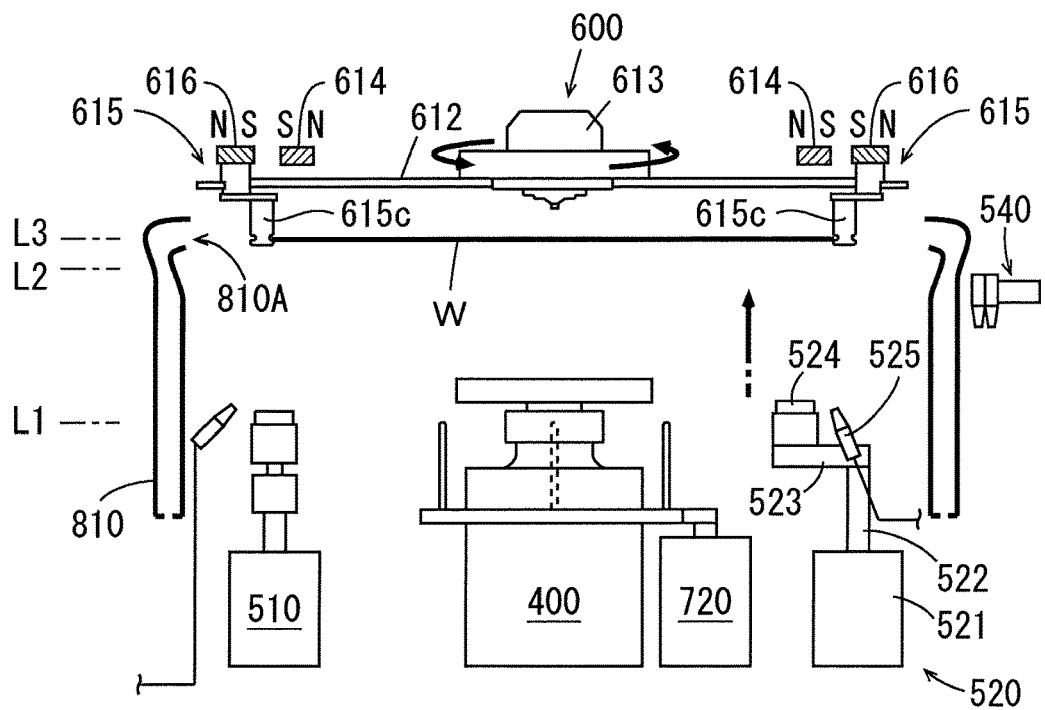
FIG. 16 is a side view for explaining the cleaning processing for the substrate by the cleaning drying processing unit.

Thereafter, as indicated by a thick one-dot and dash arrow in FIG. 15, the plurality of lifting lowering pins 723 are moved downward. Further, as indicated by a thick dotted arrow in FIG. 15, the splash prevention cup 810 is moved upward. Thus, as shown in FIG. 16, the upper ends of the plurality of lifting lowering pins 723 are held at the height L1. At this time, with the annular opening 810A being opposite to the outer peripheral end of the substrate W, the splash prevention cup 810 is held. In this state, the substrate W is rotated. The gas in the inner space is sucked into the annular opening 810A, so that a flow of gas flowing from the outer peripheral end of the rotating substrate W to the annular opening 810A is formed.

Figure 17:
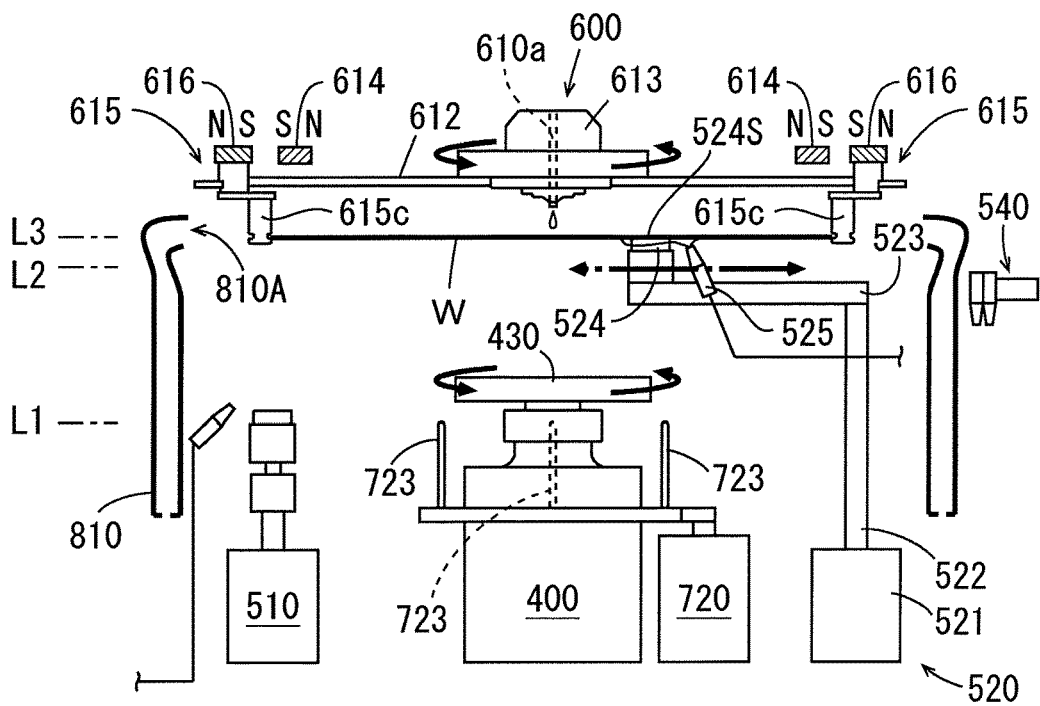
FIG. 17 is a side view for explaining the cleaning processing for the substrate by the cleaning drying processing unit.

Then, as indicated by a thick one-dot and dash arrow in FIG. 16, the brush 524 of the second back surface cleaning mechanism 520 is moved upward. Thus, as shown in FIG. 17, the cleaning surface 524S of the brush 524 comes into contact with a region further inward than the peripheral portion of the back surface of the substrate W. At this time, the brush 524 is pressed against the back surface of the substrate W with the pressure based on the predetermined cleaning condition. Further, the cleaning liquid is discharged from the nozzle 525 to the brush 524. Further, as indicated by a thick one-dot and dash arrow in FIG. 17, the brush 524 is moved between the center portion of the substrate W and a position further inward by a constant distance than the outer peripheral end of the substrate W. Thus, contaminants in the region further inward than the peripheral portion of the back surface of the substrate W are removed by the brush 524. Further, the contaminants removed by the brush 524 are cleaned away by the cleaning liquid. Therefore, the contaminants are prevented from adhering again to the substrate W, and a reduction in cleanliness of the brush 524 is inhibited. The cleaning liquid splashed from the rotating substrate W is sucked into the annular opening 810A together with the gas in the inner space. Thus, the cleaning liquid splashed from the substrate W is prevented from adhering again to the back surface of the substrate W.

At this time, part of the contaminants removed by the brush 524 and part of the cleaning liquid supplied to the brush 524 fall on the suction holder 430 of the lower spin chuck 400. In the present embodiment, in a period during which the back surface of the substrate W is cleaned by the second back surface cleaning mechanism 520, the suction holder 430 is rotated. Thus, the contaminants and cleaning liquid that fall on the suction holder 430 are shaken off from the suction holder 430 by a centrifugal force. Therefore, adherence of contaminants to the suction holder 430 is inhibited.

During the back surface cleaning for the substrate W by the second back surface cleaning mechanism 520, the cleaning liquid may be supplied to the upper surface of the substrate W through the liquid supply pipe 610a of the upper spin chuck 600. In this case, the main surface of the substrate W is cleaned together with the region further inward than the peripheral portion of the back surface of the substrate W.

When the back surface cleaning for the substrate W by the second back surface cleaning mechanism 520 is finished, the second back surface cleaning mechanism 520 returns to the initial state. Thereafter, the substrate W is successively rotated for a constant period, so that the cleaning liquid adhering to the substrate W is shaken off. Also during this drying processing, with the annular opening 810A being opposite to the outer peripheral end of the substrate W, the splash prevention cup 810 is held. Thus, the cleaning liquid splashed from the substrate W is prevented from adhering again to the back surface of the substrate W. When the back surface of the substrate W is dried, the rotation of the substrate W by the upper spin chuck 600 is stopped. Further, the substrate W held by the upper spin chuck 600 is transferred onto the plurality of lifting lowering pins 723 of the receiving transferring mechanism 720 in an opposite order to the above-mentioned order. Finally, the substrate W after cleaning is received by the transport mechanism 141 of FIG. 1, and is carried out from the cleaning drying processing unit SD1.

(9) Flow of Gas Around Substrate

Figure 18:
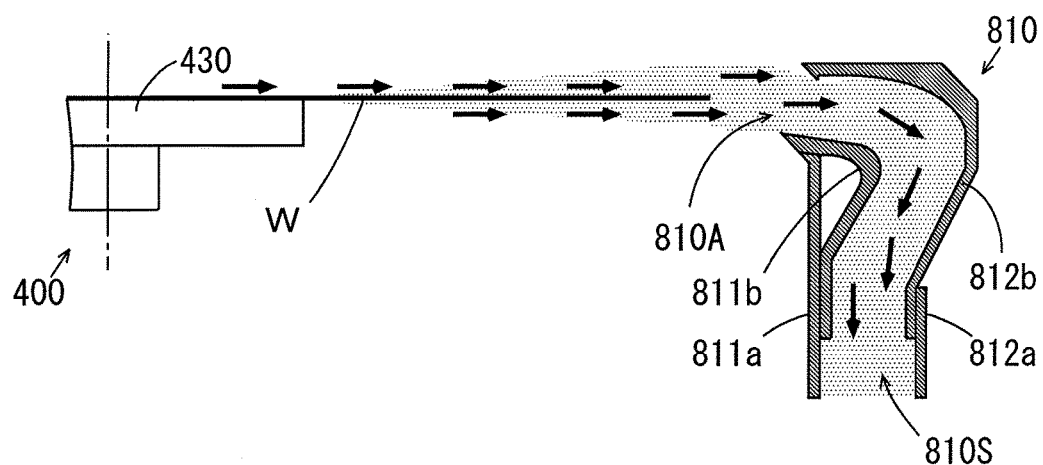
FIG. 18 is a schematic diagram showing a flow of gas in an inner space when the substrate is rotated by a lower spin chuck.

The inventor of the present application analyzed a flow of gas in the inner space by simulation when the substrate W is rotated by the lower spin chuck 400 in the cleaning drying processing unit SD1. FIG. 18 is a schematic diagram showing a flow of gas in the inner space when the substrate W is rotated by the lower spin chuck 400. In FIG. 18, in the inner space and the space in the vicinity of the inner space, a region having a flow of gas flowing at a speed higher than a predetermined threshold value is indicated by a dotted pattern. Further, directions in which the gas flows are indicated by thick solid arrows.

With the annular opening 810A of the splash prevention cup 810 being opposite to the outer peripheral end of the rotating substrate W, the gas in the inner space is sucked into the annular opening 810A. In this case, as shown in FIG. 18, a flow of gas flowing from the outer peripheral end of the rotating substrate W towards the annular opening 810A is formed. A flow of gas flowing towards a space below the substrate W through a gap between the outer peripheral end of the substrate W and the annular opening 810A is shielded, so that occurrence of turbulence in the inner space is prevented.

The gas sucked into the first annular space 810S from the annular opening 810A is smoothly led downward along the inner peripheral surface of the outer upper member 812b. Further, in the above-mentioned splash prevention cup 810, because the inner peripheral surface of the outer upper member 812b facing the annular opening 810A is curved to bulge outward, the gas colliding with the inner peripheral surface of the outer upper member 812b is not reflected in a direction of returning to the annular opening 810A, and is received at the curved inner peripheral surface. Therefore, in the case where the gas in the inner space is sucked into the annular opening 810A together with splashes and a mist of the cleaning liquid, the gas, and splashes and a mist of the cleaning liquid that are sucked into the annular opening 810A are prevented from leaking from the annular opening 810A.

Further, in the above-mentioned splash prevention cup 810, a passage extending substantially in parallel with the substrate W from the upper edge and the lower edge of the annular opening 810A to connect to the first annular space 810S is formed by the inner upper member 811b and the outer upper member 812b. Thus, a flow of gas parallel to the substrate W is smoothly formed to flow from the outer peripheral end of the substrate W towards the annular opening 810A. Therefore, splashes and a mist of the cleaning liquid splashed from the substrate W are prevented from flowing upward or downward of the annular opening 810A.

Figure 19:
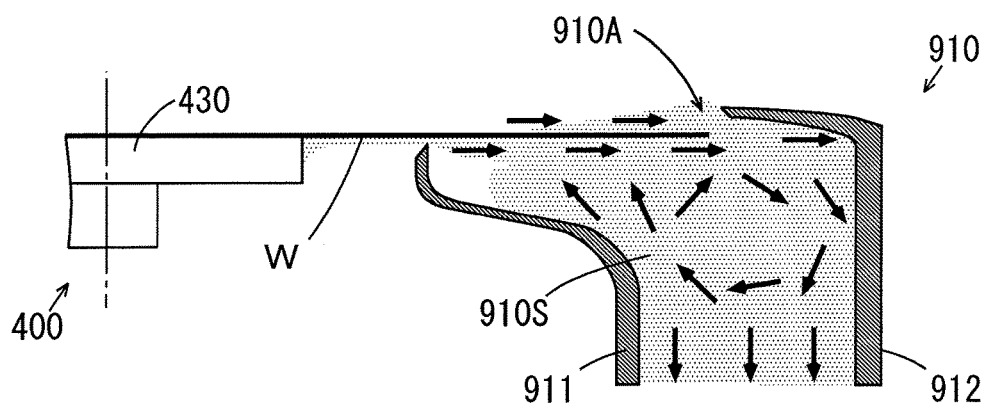
FIG. 19 is a schematic diagram showing a flow of gas in the inner space when the substrate is rotated by the lower spin chuck, in the case where a splash prevention cup according to a first comparative example is used.

The inventor of the present application analyzed, in the case where the conventional splash prevention cup according to the first comparative example is used instead of the above-mentioned splash prevention cup 810, a flow of gas in the inner space by simulation when the substrate W is rotated by the lower spin chuck 400. FIG. 19 is a schematic diagram showing a flow of gas in the inner space when the substrate W is rotated by the lower spin chuck 400, in the case where the splash prevention cup according to the first comparative example is used. Also in FIG. 19, similarly to the example of FIG. 18, in the inner space and the space in the vicinity of the inner space, a region having a flow of gas flowing at a speed higher than the predetermined threshold value is indicated by the dotted pattern. Further, directions in which the gas flows are indicated by thick solid arrows.

The splash prevention cup 910 according to the first comparative example has an inner wall member 911 and an outer wall member 912. The inner wall member 911 is an annular member having an outer diameter smaller than the diameter of the substrate W, and surrounds the lower spin chuck 400 at a position below the substrate W held by the lower spin chuck 400.

The outer wall member 912 is provided to surround the outside of the inner wall member 911. An upper portion of the outer wall member 912 is curved inward. An annular space 910S is formed between the inner wall member 911 and the outer wall member 912. An annular opening 910A directed upward is formed between the upper end of the inner wall member 911 and the upper end of the outer wall member 912.

With a portion having a constant width from the outer peripheral end of the substrate W covering part of the annular opening 910A of the splash prevention cup 910 from above, the gas in the inner space is sucked into the annular opening 910A. In this case, at a position higher than the substrate W, a flow of gas is formed to flow from a position above the main surface of the substrate W towards a gap between the outer peripheral end of the substrate W and an inner edge of the upper end of the outer wall member 912. On the one hand, at a position lower than the substrate W, spiral turbulence is formed in a region in the vicinity of the peripheral portion of the substrate W in the annular space 910S. This turbulence is generated due to a flow of gas flowing into the annular space 910S through the gap between the outer peripheral end of the substrate W and an inner edge of the upper end of the outer wall member 912, and the flow of gas flowing into the annular space 910S from a gap between the back surface of the substrate W and the upper end of the inner wall member 911.

Therefore, when the gas in the inner space is sucked into the annular opening 910A together with splashes and a mist of the cleaning liquid, the splashes and the mist of the cleaning liquid sucked into the annular opening 910A are likely to adhere again to the back surface of the substrate W due to the turbulence generated in the space below the substrate W.

In this manner, according to the result of simulation of FIG. 19, it is found that, in the splash prevention cup 910 according to the first comparative example, the cleaning liquid cannot be prevented from adhering again to the back surface of the substrate W during the cleaning and drying processing for the substrate W rotated by the lower spin chuck 400.

Figure 20:
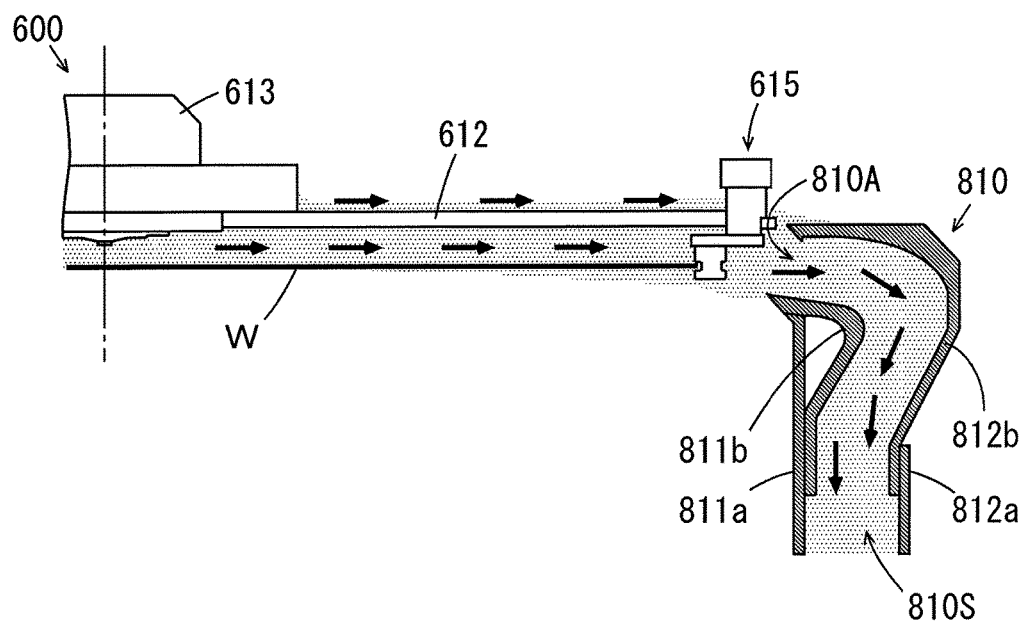
FIG. 20 is a schematic diagram showing a flow of gas in the inner space when the substrate is rotated by the upper spin chuck.

Further, the inventor of the present application analyzed a flow of gas in the inner space in the cleaning drying processing unit SD1 by simulation when the substrate W is rotated by the upper spin chuck 600. FIG. 20 is a schematic diagram showing the flow of gas in the inner space when the substrate W is rotated by the upper spin chuck 600. Also in FIG. 20, similarly to the example of FIG. 18, in the inner space and the space in the vicinity of the inner space, a region having a flow of gas flowing at a speed higher than the predetermined threshold value is indicated by the dotted pattern. Further, directions in which the gas flows are indicated by thick solid arrows.

With the annular opening 810A of the splash prevention cup 810 being opposite to the outer peripheral end of the rotating substrate W, the gas in the inner space is sucked into the annular opening 810A. According to the result of simulation of FIG. 20, also in the case where the substrate W is rotated by the upper spin chuck 600, a flow of gas similar to the example of FIG. 18 is formed in the inner space and a space in the vicinity of the inner space. Therefore, it is found that, in the case where the gas in the inner space is sucked into the annular opening 810A together with splashes and a mist of the cleaning liquid, the gas, the splashes and the mist of the cleaning liquid sucked into the annular opening 810A are prevented from leaking from the annular opening 810A. Further, it is found that splashes and a mist of the cleaning liquid splashed from the substrate W are prevented from flowing upward and downward of the annular opening 810A.

Figure 21:
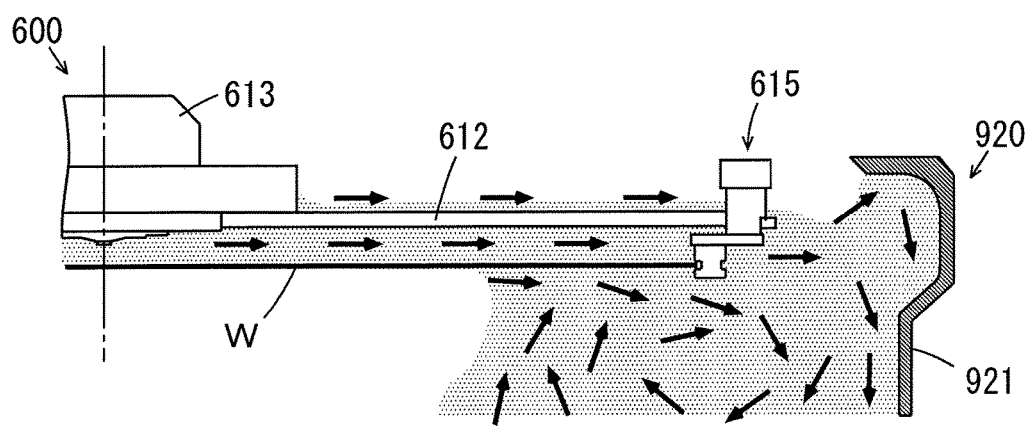
FIG. 21 is a schematic diagram showing a flow of gas in the inner space when the substrate is rotated by the upper spin chuck, in the case where a splash prevention cup according to a second comparative example is used.

The inventor of the present application analyzed, in the case where the conventional splash prevention cup according to the second comparative example is used instead of the above-mentioned splash prevention cup 810, a flow of gas in the inner space by simulation when the substrate W is rotated by the upper spin chuck 600. FIG. 21 is a schematic diagram showing a flow of gas in the inner space when the substrate W is rotated by the upper spin chuck 600, in the case where the splash prevention cup according to the second comparative example is used. Also in FIG. 21, similarly to the example of FIG. 18, in the inner space and the space in the vicinity of the inner space, a region having a flow of gas flowing at a speed higher than the predetermined threshold value is indicated by the dotted pattern. Further, directions in which the gas flows are indicated by thick solid arrows.

As shown in FIG. 21, the splash prevention cup 920 according to the second comparative example is constituted only by one substantially cylindrical outer wall member 921. The outer wall member 921 has an inner diameter larger than the diameter of the substrate W and the diameter of the spin plate 612. An upper portion of the outer wall member 921 is curved inward.

The outer wall member 921 is provided to surround the spin plate 612, and be located such that the upper end is located at a position higher than the substrate W. A constant gap is formed between the spin plate 612 and the outer wall member 921.

When the gas inside of the outer wall member 921 including the inner space is sucked downward, a flow of gas flowing from a position above the main surface of the substrate W towards the inner peripheral surface of the outer wall member 921 is formed at a position higher than the substrate W. On the one hand, at a position lower than the substrate W, spiral turbulence is formed in a region in the vicinity of the peripheral portion of the substrate W. This turbulence is generated due to a flow of gas flowing to a position below the substrate W through a gap between the outer peripheral end of the substrate W and the outer wall member 921.

Therefore, similarly to the example of FIG. 19, when the gas in the inner space is sucked into the annular opening 910A together with splashes and a mist of the cleaning liquid, the splashes and the mist of the cleaning liquid sucked into the annular opening 910A are likely to adhere again to the back surface of the substrate W due to the turbulence generated in a space below the substrate W.

In this manner, according to the result of simulation of FIG. 21, it is found that the cleaning liquid cannot be prevented from adhering again to the back surface of the substrate W during the cleaning and dry processing for the substrate W rotated by the upper spin chuck 600 by the splash prevention cup 920 according to the second comparative example.

(10) Annular Plate Member of Splash Prevention Cup

As described above, the plurality of communication holes 814 are dispersively arranged in the annular plate member 813 of the splash prevention cup 810. Thus, with a simple configuration, the first inner wall member 811a and the first outer wall member 812a are coupled to each other, and the first annular space 810S and the second annular space 820S communicate with each other.

When the gas in the inner space is sucked into the annular opening 810A, the gas in the first annular space 810S is led to the second annular space 820S at a plurality of positions dispersed in the circumferential direction. Thus, the gas in the first annular space 810S, and splashes and a mist of the cleaning liquid are led to the entire second annular space 820S.

The suction force for the gas in the second annular space 820S of the storage member 820 decreases as the gas is positioned farther away from the first opening 822P formed at the second outer wall member 822. Therefore, in the annular plate member 813 of the splash prevention cup 810, as shown in FIGS. 8 and 9, distances between the adjacent communication holes 814 are preferably formed to decrease as the communication holes 814 are positioned farther away from the first opening 822P.

In this case, it is possible to substantially uniformly lead the gas in the first annular space 810S, and splashes and a mist of the cleaning liquid to the entire second annular space 820S without providing a plurality of openings for suction at the second outer wall member 822. As a result, splashes and a mist of the cleaning liquid splashed from the entire circumference of the substrate W are substantially uniformly sucked into the annular opening 810A.

(11) Effects

During the cleaning and drying processing for the substrate W, the splash prevention cup 810 is supported by the cup lifting lowering device 830 such that the annular opening 810A is opposite to the outer peripheral end of the substrate W. With the annular opening 810A being opposite to the outer peripheral end of the substrate W, the gas in the inner space including the substrate W is sucked by the gas discharge pipe 892 through the annular opening 810A, the first annular space 810S, the second annular space 820S, and the gas discharge space formation member 880. Thus, a flow of gas flowing from the outer peripheral end of the rotating substrate W towards the annular opening 810A is formed. At this time, because a flow of gas flowing towards a position below the substrate W through a gap between the outer peripheral end of the substrate W and the annular opening 810A is shielded, occurrence of turbulence in the inner space is prevented.

Splashes and a mist of the cleaning liquid splashed outward from the outer peripheral end of the rotating substrate W are sucked into the first annular space 810S from the annular opening 810A together with gas, and are led to the liquid discharge pipe 891 through the second annular space 820S.

In this case, because the inner space is surrounded by the first inner wall member 811a and the second inner wall member 821, splashes and a mist of the cleaning liquid sucked into the first annular space 810S are prevented from returning to a space on the back surface side of the substrate W. Because the splash prevention cup 810 is moved in the up-and-down direction with the lower portion of the splash prevention cup 810 being stored in the storage member 820, gas, and splashes and a mist of the cleaning liquid are prevented from leaking to the inner space from the boundary portion between the first annular space 810S and the second annular space 820S. As a result, the cleaning liquid splashed from the substrate W is prevented from adhering again to the back surface of the substrate W.

(12) Other Embodiments (12-1) While each of the cleaning drying processing units SD1, SD2 has the lower spin chuck 400 and the upper spin chuck 600 in the above-mentioned embodiment, the present invention is not limited to this.

For example, each of the cleaning drying processing units SD1, SD2 may have only the lower spin chuck 400 of the lower spin chuck 400 and the upper spin chuck 600. In this case, in each of the cleaning drying processing units SD1, SD2, the peripheral portion of the back surface of the substrate W and the outer peripheral end of the substrate W are cleaned by the first back surface cleaning mechanism 510, and the main surface of the substrate W is cleaned by the main surface cleaning mechanism 540.

Alternatively, each of the cleaning drying processing units SD1, SD2 may have only the upper spin chuck 600 of the lower spin chuck 400 and the upper spin chuck 600. In this case, in each of the cleaning drying processing units SD1, SD2, the back surface of the substrate W is cleaned by the second back surface cleaning mechanism 520.

(12-2) While the plurality of circular communication holes 814 are formed in the annular plate member 813 of the splash prevention cup 810 in the above-mentioned embodiment, the present invention is not limited to this. Each communication hole 814 may be formed to be rectangular or oval instead of circular. Further, only one communication hole 814 may be formed in the annular plate member 813.

(12-3) In the above-mentioned embodiment, the splash prevention cup 810 of FIGS. 8 and 9 may be used as the cups 27, 37 of the coating processing unit 129 and the development processing unit 139 that supply the cleaning liquid to the main surface of the substrate W. In this case, the storage member 820 and the gas discharge space formation member 880 of FIGS. 8 and 9 are provided in each of the coating processing unit 129 and the development processing unit 139, so that the processing liquid does not adhere to the back surface of the substrate W during the coating processing and the development processing. Therefore, occurrence of processing defects resulting from the adherence of the processing liquid to the back surface of the substrate W is prevented.

(12-4) While the splash prevention cup 810 according to the above-mentioned embodiment mainly has the configuration in which the first inner wall member 811a, the inner upper member 811b, the first outer wall member 812a, the outer upper member 812b and the annular plate member 813 are joined to one another, the present invention is not limited to this.

In the splash prevention cup 810, part or all of the first inner wall member 811a, the inner upper member 811b, the first outer wall member 812a, the outer upper member 812b, and the annular plate member 813 may be fabricated by integral formation.

(13) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the lower spin chuck 400 and the upper spin chuck 600 are examples of a substrate holder, the first back surface cleaning mechanism 510, the second back surface cleaning mechanism 520 and the main surface cleaning mechanism 540 are examples of a processing liquid supplier, the splash prevention cup 810 is an example of a splash preventer, the storage member 820 is an example of a storage, the cup lifting lowering device 830 is an example of a driver, and the gas discharge pipe 892 is an example of a gas discharger.

Further, the first inner wall member 811a is an example of a first inner wall, the first outer wall member 812a is an example of a first outer wall, the first annular space 810S is an example of a first annular space, the annular plate member 813 is an example of a coupler and an annular plate, the outer upper member 812b is an example of an annular outer upper member, the inner upper member 811b is an example of an annular inner upper member, and the annular opening 810A is an example of an annular opening.

Further, the second inner wall member 821 is an example of a second inner wall, the second outer wall member 822 is an example of a second outer wall, the second annular space 820S is an example of a second annular space, the bottom plate 823 is an example of a bottom member, the cleaning drying processing units SD1, SD2 and the substrate processing apparatus 100 are examples of a substrate processing apparatus.

Further, the plurality of communication holes 814 is an example of one or a plurality of communication openings and a plurality of communication holes, the gas discharge space formation member 880 is an example of a gas discharge space former, the liquid discharge pipe 891 is an example of a liquid discharger, the first opening 822P is an example of a first opening, the second opening 882 is an example of a second opening and the liquid discharge port 881 is an example of a liquid discharge port.

Further, the suction holder 430 is an example of a suction holder, the spin motor 410 is an example of a first rotation driver, the spin plate 612 and the plate support member 613 are examples of a rotator, the spin motor 611 is an example of a second rotation driver, and the plurality of chuck pins 615 are examples of an abutment holder.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing for various types of substrates.

I claim:

1. A substrate processing apparatus comprising:
   a substrate holder that holds and rotates a substrate having at least a part having a circular shape about a vertical axis;
   a processing liquid supplier that supplies a processing liquid to the substrate held by the substrate holder;
   a splash preventer configured to receive the processing liquid splashed to surroundings from the rotating substrate;
   a storage that stores a lower portion of the splash preventer;
   a driver that moves the splash preventer in an up-and-down direction relative to the storage; and
   a gas discharger, wherein
   the splash preventer includes
   a first inner wall provided to surround an inner space including the substrate held by the substrate holder and a region lower than the substrate and having a cylindrical shape from an upper end to a lower end of the first inner wall,
   a first outer wall provided to surround outside of the first inner wall and having a cylindrical shape from an upper end to a lower end of the first outer wall,
   a coupler that couples the first inner wall to the first outer wall such that a first annular space is formed between the first inner wall and the first outer wall, and
   a circular annular outer upper member connected to the first outer wall to cover an upper portion of the first annular space,
   a circular annular opening being able to be opposite to an outer peripheral end of the substrate held by the substrate holder is formed between the first inner wall and the circular annular outer upper member,
   the storage includes
   a second inner wall provided to surround the inner space,
   a second outer wall provided to surround outside of the second inner wall, and
   a bottom member that couples the second inner wall to the second outer wall such that a second annular space is formed between the second inner wall and the second outer wall,
   the lower portion of the splash preventer is stored in the second annular space of the storage to be movable in the up-and-down direction such that the first annular space and the second annular space of the splash preventer communicate with each other, and
   the gas discharger is provided to suck gas in the inner space through the circular annular opening, the first annular space and the second annular space to discharge the gas from the second annular space with the circular annular opening being opposite to the peripheral end of the substrate held by the substrate holder.

2. The substrate processing apparatus according to claim 1, wherein
   the coupler includes an annular plate that couples a lower end of the first inner wall to a lower end of the first outer wall, and
   the annular plate has one or a plurality of communication openings that connects the first annular space to the second annular space.

3. The substrate processing apparatus according to claim 2, wherein
   the one or the plurality of communication openings includes a plurality of communication holes dispersively arranged in a circumferential direction.

4. The substrate processing apparatus according to claim 3, wherein
   the gas discharger is provided to communicate with the second annular space in one portion of the storage, and
   the plurality of communication holes are sized such that the greater the distance that a pair of adjacent communication holes are separated from the one portion of the storage, the smaller the distance between said pair of adjacent communication holes.

5. The substrate processing apparatus according to claim 1, further comprising:
   a gas discharge space former formed to surround a space coming into contact with a partial region of an outer peripheral surface of the second outer wall as a gas discharge space; and
   a liquid discharger, wherein
   a first opening that connects the second annular space to the gas discharge space is provided at the partial region of the second outer wall,
   a second opening that connects the gas discharge space to the gas discharger is provided at the air discharge space former,
   the second opening is located at a position higher than the first opening, and
   a liquid discharge port that connects the second annular space to the liquid discharger is provided at the bottom member of the storage.

6. The substrate processing apparatus according to claim 1, wherein
   the circular annular outer upper member is curved outward and upward from the upper end of the first outer wall, and further curved inward to cover an upper portion of the first annular space, and forms an upper edge of the circular annular opening.

7. The substrate processing apparatus according to claim 6, wherein the splash preventer further includes an annular inner upper member that is curved outward and upward from the first inner wall and further curved inward to form a lower edge of the circular annular opening.

8. The substrate processing apparatus according to claim 1, wherein the substrate holder includes a suction holder that is configured to be rotatable about the vertical axis and sucks a center portion of a lower surface of the substrate, and a first rotation driver that rotates the suction holder.

9. The substrate processing apparatus according to claim 1, wherein the substrate holder includes a rotator configured to be rotatable about the vertical axis, a second rotation driver that rotates the rotator, and an abutment holder that is arranged below the rotator and holds the substrate by abutting against the outer peripheral end of the substrate.

\* \* \* \* \*